(12) United States Patent
Juengling

(10) Patent No.: US 10,504,905 B2
(45) Date of Patent: *Dec. 10, 2019

(54) MEMORY ARRAYS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/965,703

(22) Filed: Apr. 27, 2018

(65) Prior Publication Data

US 2018/0247942 A1    Aug. 30, 2018

Related U.S. Application Data

(62) Division of application No. 15/391,138, filed on Dec. 27, 2016, now Pat. No. 10,008,504.

(51) Int. Cl.
*H01L 27/108*    (2006.01)

(52) U.S. Cl.
CPC .. *H01L 27/10826* (2013.01); *H01L 27/10847* (2013.01)

(58) Field of Classification Search
None
See application file for complete search history.

(56) References Cited

U.S. PATENT DOCUMENTS

| 8,741,758 | B2 | 6/2014 | Juengling | |
|---|---|---|---|---|
| 9,589,966 | B2 | 3/2017 | Hsu | |
| 9,773,728 | B1* | 9/2017 | Juengling | H01L 23/5225 |
| 2007/0052040 | A1 | 3/2007 | Schwerin | |
| 2009/0237996 | A1 | 9/2009 | Kirsch et al. | |
| 2011/0193157 | A1 | 8/2011 | Juengling | |
| 2012/0156844 | A1* | 6/2012 | Kim | H01L 27/10823 438/270 |
| 2012/0212989 | A1* | 8/2012 | Yu | G11C 7/02 365/51 |
| 2012/0299090 | A1* | 11/2012 | Kim | H01L 27/10873 257/331 |
| 2014/0185355 | A1 | 7/2014 | Juengling | |
| 2014/0349450 | A1* | 11/2014 | Okhonin | G11C 11/39 438/197 |
| 2015/0129955 | A1* | 5/2015 | Mueller | G11C 11/40 257/329 |
| 2016/0322363 | A1* | 11/2016 | Tomishima | G11C 8/005 |

* cited by examiner

*Primary Examiner* — Alexander G Ghyka
(74) *Attorney, Agent, or Firm* — Wells St. John P.S.

(57) ABSTRACT

Some embodiments include a memory array having rows of fins. Each fin has at least one channel region. Each channel region extends from a first source/drain region to a second source/drain region. The channel regions within each row of fins include first channel regions and second channel regions. Wordline configurations extend along the rows of fins. Each wordline configuration has a first wordline component operated in tandem with a second wordline component. The first wordline components electrically couple with only the first channel regions and the second wordline components electrically couple with only the second channel regions.

10 Claims, 26 Drawing Sheets

MEMORY ARRAYS

RELATED PATENT DATA

This patent resulted from a divisional of U.S. patent application Ser. No. 15/391,138, which was filed Dec. 27, 2016, and which is hereby incorporated herein by reference.

TECHNICAL FIELD

Memory arrays.

BACKGROUND

Fin field effect transistors (finFETs) may be incorporated into integrated circuitry. The finFETs include a fin (a tall thin semiconductor member) extending generally perpendicularly from a substrate. The fin comprises a pair of opposing sidewalls, and gate material is provided along at least one of the sidewalls. The gate material is spaced from said at least one of the sidewalls by gate dielectric material. A pair of source/drain regions is provided within the fin, and a channel region extends between the source/drain regions. In operation, the gate is utilized to selectively control current flow within the channel region.

The finFETs may be utilized as access transistors in integrated memory arrays; such as, for example, dynamic random access memory (DRAM) arrays. In some applications the finFETs may be incorporated into crosshair memory cells. In such applications the source/drain regions are on a pair of upwardly-projecting pedestals, and the channel region is along a trough extending between the pedestals. A charge-storage device (for instance, a capacitor) is electrically coupled with one of the source/drain regions, and a digit line is electrically coupled with the other of the source/drain regions. The gate is beneath the source/drain regions, and extends along the trough comprising the channel region. Example finFET structures, and example crosshair memory cells, are described in U.S. Pat. No. 8,741,758, and U.S. patent publication numbers 2009/0237996 and 2011/0193157.

It is desired to develop improved finFET devices which are suitable for utilization in highly integrated applications, to develop improved architectures for incorporating finFET devices into highly integrated memory and/or other circuitry, and to develop improved methods of fabricating architectures comprising finFET devices.

DETAILED DESCRIPTION OF THE ILLUSTRATED EMBODIMENTS

Figure 1:
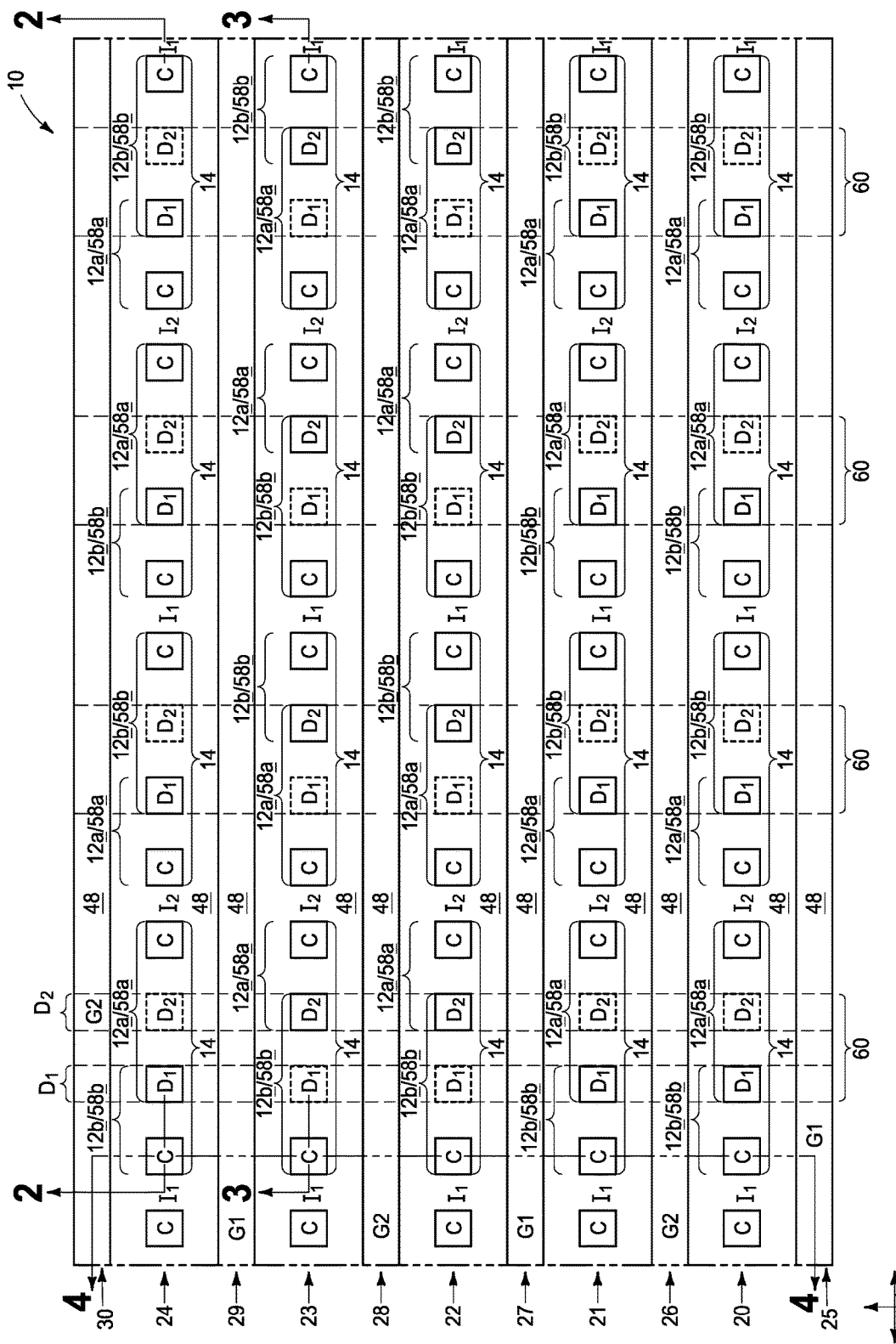
FIGS. 1-4 are a diagrammatic sectional top view and diagrammatic cross-sectional side views of a region of an example memory array. The view of FIG. 2 is along the lines 2-2 of FIG. 1; the view of FIG. 3 is along the lines 3-3 of FIG. 1; and the view of FIG. 4 is along the lines 4-4 of FIG. 1. The view of FIG. 1 is along the lines 1-1 of FIGS. 2-4.

Some embodiments include a memory array having access transistors which include fins of semiconductor material. The fins may be arranged along rows of the memory array. Channel regions are within the fins, and include first channel regions and second channel regions. Wordline configurations extend along the rows, with each wordline configuration having a first wordline component operated in tandem with a second wordline component. The first wordline components overlap only the first channel regions, and the second wordline components overlap only the second channel regions. These and other aspects are described with reference to FIGS. 1-25.

A portion of an example memory array 10 is diagrammatically illustrated in FIGS. 1-4. The memory array 10 includes a plurality of fins 14 of semiconductor material 16. The fins are arranged in rows 20-24; with such rows extending along a direction of an axis 5 (the axis 5 is shown adjacent the top view of FIG. 1). The rows are spaced from one another by gaps 25-30. Such gaps alternate between first-type gaps (indicated by label "G1") and second-type gaps (indicated by label "G2").

The semiconductor material 16 of fins 14 may comprise any suitable semiconductor material, and in some embodiments may comprise, consist essentially of, or consist of silicon.

The fins 14 are spaced from one another by regions 15 comprising insulative material 48, and labeled as $I_1$ or $I_2$. The regions 15 may be deep trenches in some embodiments. The insulative material 48 within the regions 15 may comprise any suitable electrically insulative composition or combination of compositions; such as, for example silicon dioxide, silicon nitride, etc. The labels $I_1$ and $I_2$ are used to indicate relative locations (i.e., the regions identified by the label $I_1$ alternate with the regions identified by the label $I_2$ along the rows 20-24) rather than to indicate chemical or other differences.

Each fin 14 comprises a pair of outer pedestals 32 and an inner pedestal 34 between the outer pedestals. The outer pedestals 32 may be referred to as first pedestals, and the inner pedestals 34 may be referred to as second pedestals.

The pedestals 32/34 are labeled as "C", "$D_1$" or "$D_2$" in the top down view of FIG. 1, with such labels indicating a component coupled to each of the respective pedestals. The pedestals 32/34 may have any suitable dimensions in the top-down view of FIG. 1, including, for example, F/2, F/4, etc., where F is a minimum feature size of a photolithographic process utilized during fabrication of the pedestals 32/34.

Figure 2:
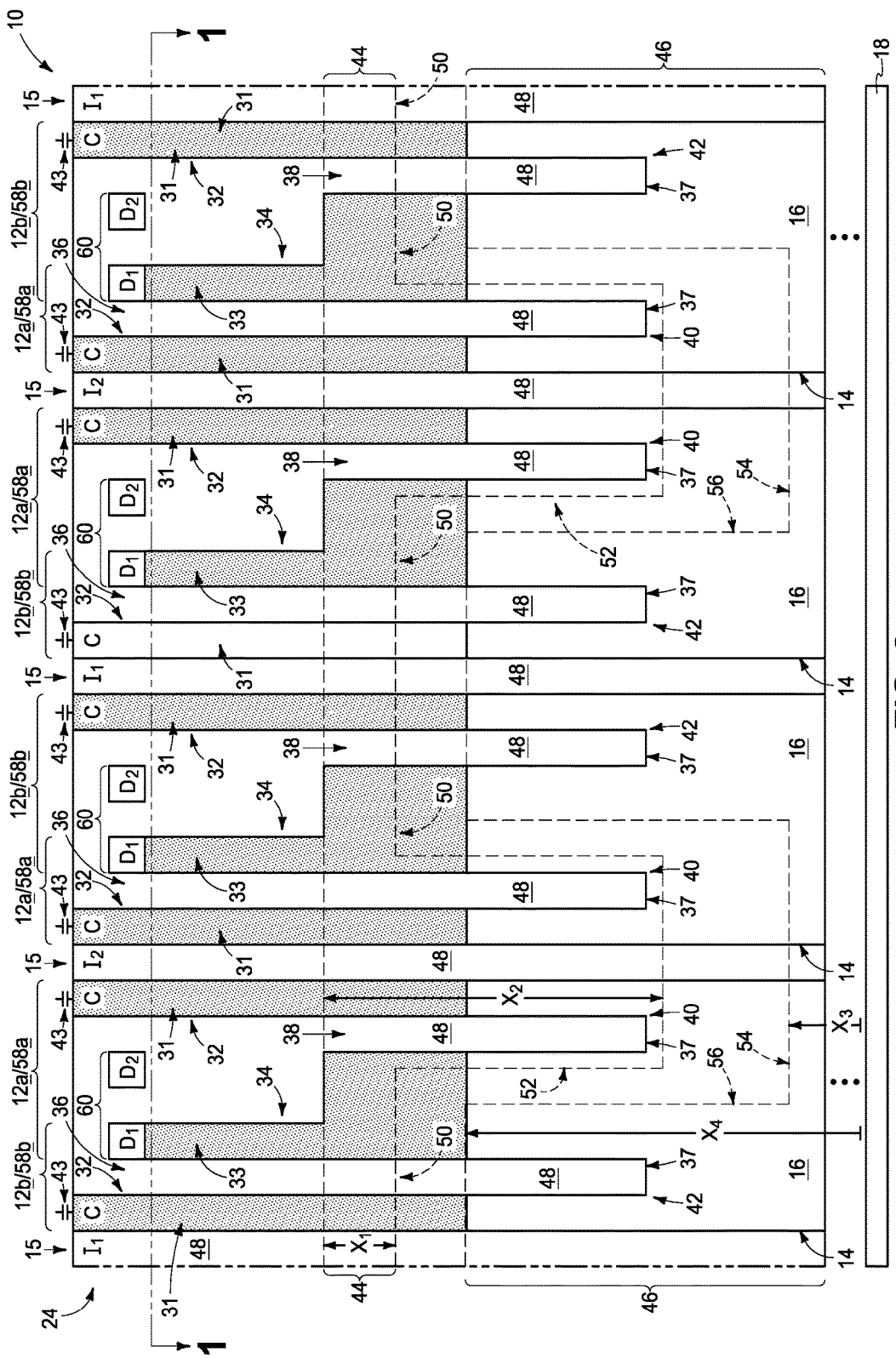
Figure 3:
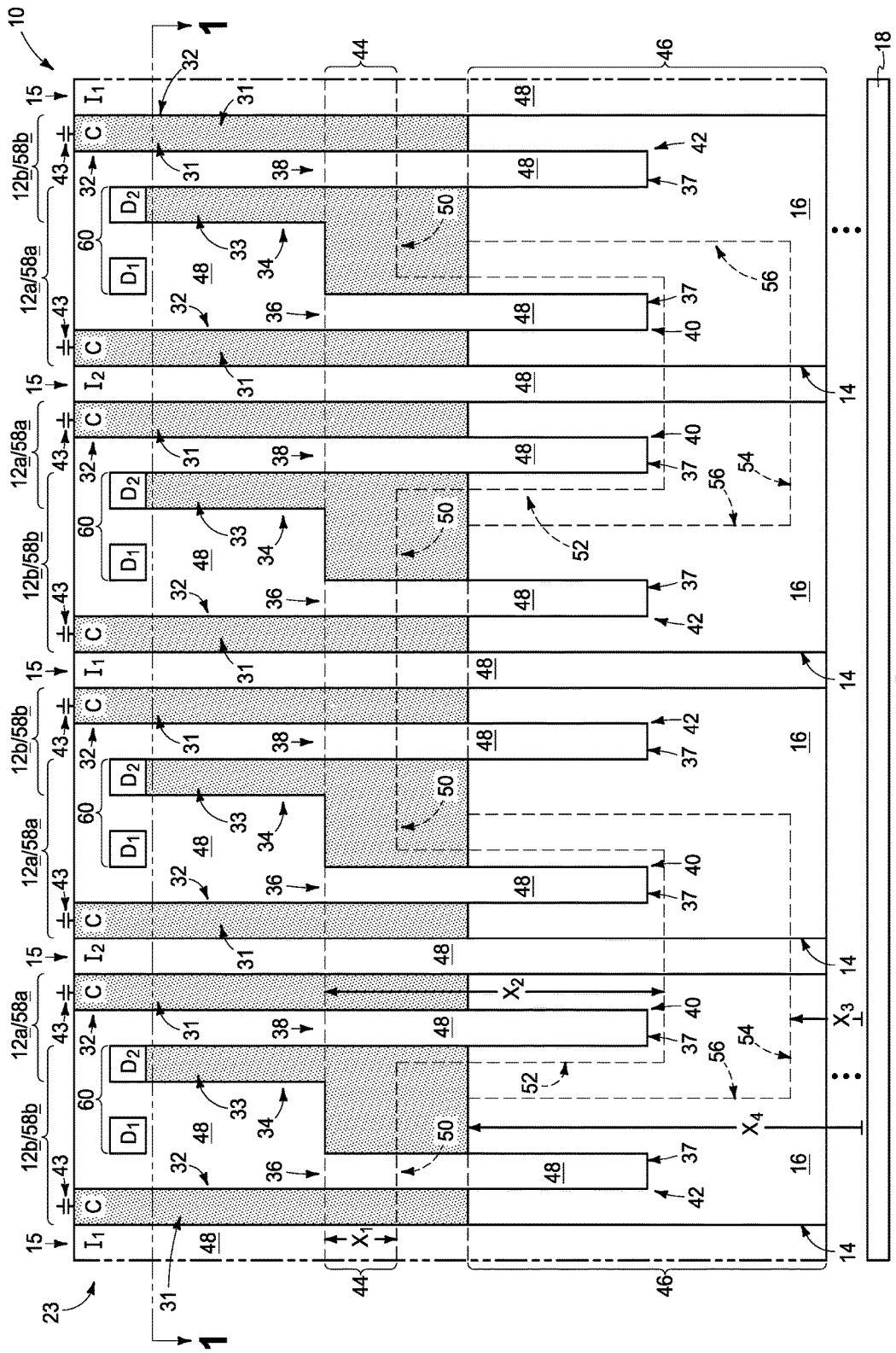
Figure 4:
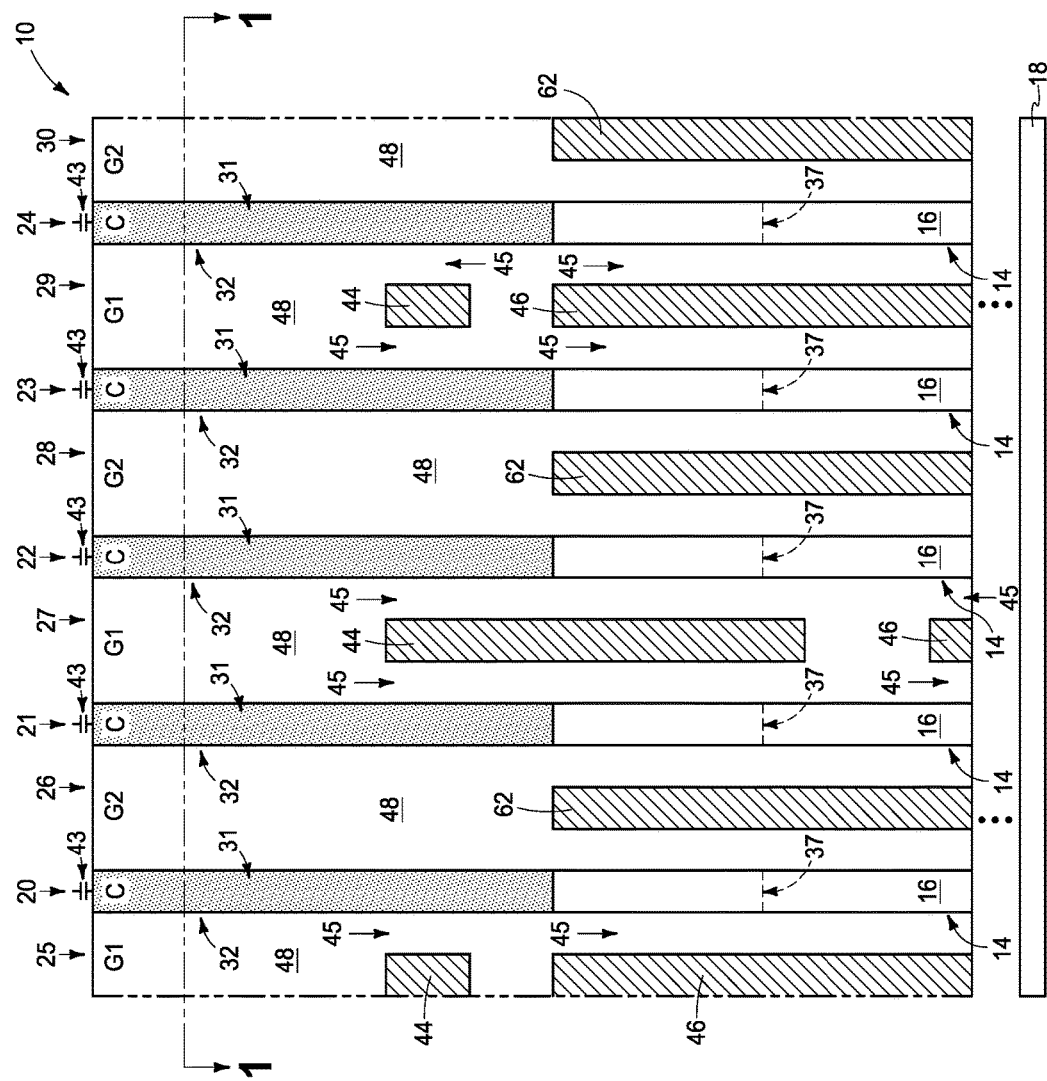

The fins 14 extend upwardly from a substrate 18 (shown in FIGS. 2-4). The substrate 18 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the substrate 18 may correspond to a semiconductor substrate containing one or more materials associated with integrated circuit fabrication. Such materials may include, for example, one or more of refractory metal materials, barrier materials, diffusion materials, insulator materials, etc. The substrate 18 is illustrated to be spaced from fins 14 to indicate that there may be circuitry, materials, levels, etc. (not shown) between the substrate 18 and the fins 14 in some embodiments.

Each of the fins 14 comprises a first trough 36 between one of the outer (first) pedestals 32 and the inner (second) pedestal 34, and a second trough 38 between the other of the outer (first) pedestals 32 and the inner (second) pedestal 34. The troughs 36/38 have bottom edges 37. The bottom edges 37 are shown in FIGS. 2 and 3. The bottom edges 37 are also diagrammatically illustrated in phantom (dashed line) in FIG. 4 since they are out of the plane of the FIG. 4 view (and specifically are behind the plane of such view).

In the shown embodiment some of the troughs 36/38 are different shapes than others. For instance, in the view of FIG. 2, the first troughs 36 are simple trenches with straight sidewalls, and the second troughs 38 are trenches with more complex sidewalls. The terms "first" and "second" are used to indicate relative locations of the troughs (i.e., the first troughs alternate with the second troughs along the rows) rather than to indicate geometrical differences. The FIG. 3 cross-section is shown to have the first troughs 36 with the more complex sidewalls and the second troughs 38 with the simple straight sidewalls.

The first pedestals 32 contain first source/drain regions 31, and the second pedestals 34 contain second source/drain regions 33. Approximate locations of the first and second source/drain regions 31/33 are indicated by stippling. Channel regions 40/42 extend along the troughs 36/38. The channel regions 40 and 42 are first channel regions and second channel regions, respectively; and differ from each other as to how they are accessed by individual wordline components (as discussed below). Some of the first channel regions 40 are associated with first troughs 36 and some with second troughs 38. Similarly, some of the second channel regions 42 are associated with second troughs 38, and others with first troughs 36. The channel regions 40/42 extend between the first source/drain regions 31 and the second source/drain regions 33.

The source/drain regions 31/33 may be heavily doped with n-type dopant (or, in some embodiments with p-type dopant). The heavy doping may correspond to, for example, a dopant concentration in excess of $10^{20}$ atoms/cm$^3$. Lower regions of fins 14 (i.e., regions of the fins 14 beneath the source/drain regions 31/33) may be intrinsically doped. The intrinsic dopant level may correspond to a dopant level of less than or equal to about $10^{15}$ atoms/cm$^3$. In some embodiments the lower regions of the fins 14 may have p-dopant levels, with such dopant levels corresponding to less than or equal to about $10^{16}$ atoms/cm$^3$.

Each fin comprises two finFET transistors 12a and 12b, which may be referred to as first and second FinFET transistors, respectively. Each of the first finFET transistors 12a comprises a first source/drain region 31, a second source/drain region 33, and a first channel region 40 between the first and second source/drain regions 31/33; and each of the second finFET transistors 12b comprises a first source/drain region 31, a second source/drain region 33, and a second channel region 42 between the first and second source/drain regions 31/33.

The first source/drain regions 31 may be electrically coupled to charge-storage devices. The charge-storage devices may correspond to any components suitable for reversibly storing charge; such as, for example, the illustrated capacitors 43. The first source/drain regions 31 are labeled with a C to indicate that they are to be electrically coupled to charge-storage devices. The capacitors 43 are diagrammatically illustrated in the cross-sectional views of FIGS. 2-4, and are not shown in the top view of FIG. 1 in order to simplify the drawing.

The second source/drain regions 33 are electrically coupled with digit line components $D_1$ and $D_2$. Adjacent digit line components $D_1$ and $D_2$ together operate as a digit line configuration 60 as discussed in more detail below. In the illustrated embodiment, upper surfaces of the first pedestals 32 are above upper surfaces of the digit line components $D_1$ and $D_2$. Such may enable charge-storage structures to be formed large enough to extend over the digit line components $D_1$ and $D_2$, which may be advantageous in some embodiments. In other embodiments the second pedestals 34 may extend to a same height as the first pedestals 32.

The digit line components $D_1$ and $D_2$ may comprise any suitable electrically conductive materials; such for example, one or more of various metals (e.g., titanium, cobalt, nickel, platinum, etc.) and/or metal-containing compositions (e.g., metal silicide, metal nitride, metal carbide, etc.) over conductively-doped semiconductor material (e.g., conductively-doped silicon, conductively-doped germanium, etc.).

First and second wordline components 44 and 46 are within the first-type gaps G1 (25/27/29); with the first wordline components 44 being vertically stacked over the second wordline components 46. The wordline components 44/46 extend along sidewalls of the fins 14, and are spaced from such sidewalls by gate dielectric material 45. The wordline components 44/46 and gate dielectric 45 are shown in FIG. 4. The wordline components 44/46 are also diagrammatically illustrated in FIGS. 2 and 3 with dashed-lines (i.e., phantom view) since the wordline components 44/46 are out of the plane relative to the views of FIGS. 2 and 3 (and specifically the wordline components 44/46 are in front of the plane of the FIG. 2 view, and behind the plane of the FIG. 3 view).

The wordline components 44/46 may comprise any suitable electrically conductive materials, such as, for example, one or more of various metals (e.g., titanium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The first wordline components 44 may comprise a same composition as the second wordline components 46 in some embodiments, and may comprise different compositions than the second wordline components 46 in other embodiments.

The wordline components 44/46 may have any suitable width dimension along the cross-section of FIG. 4; including, for example, F/2, F/4, F/6, etc., where F is a minimum feature size of a photolithographic process utilized during fabrication of the wordline components 44/46.

The gate dielectric material 45 may comprise any suitable electrically insulative material, such as, for example, silicon dioxide. In the shown embodiment the gate dielectric material 45 is shown merging with other insulative material 48. Such implies that the gate dielectric material 45 comprises a common composition as the other insulative material 48. In other embodiments the gate dielectric material 45 may comprise a different composition than at least some of the remaining insulative material 48. Further, although the insulative material 48 is illustrated to be a single homogeneous composition, in other embodiments the insulative material 48 may comprise two or more different compositions.

The upper wordline components 44 comprise horizontal regions 50 which are above the second channel regions 42, and too high to be utilized for gating the second channel regions 42. The upper wordline components 44 also comprise downwardly-extending projections 52 which overlap the first channel regions 40 such that current flow along the channel regions 40 is selectively activated by selectively energizing the upper wordline components 44. In the shown embodiment the horizontal regions 50 comprise thicknesses $X_1$ and the projections 52 comprise thicknesses $X_2$. The ratio of $X_2$ to $X_1$ may be any suitable value; for instance, in some embodiments $X_2$ may be greater than or equal to about double $X_1$, greater than or equal to about triple $X_1$, greater than or equal to about quadruple $X_1$, etc.

The lower wordline components 46 comprise horizontal regions 54 which are below the first channel regions 40, and too low to be utilized for gating the first channel regions 40. The lower wordline components 46 also comprise upwardly-extending projections 56 which overlap the second channel regions 42 such that current flow along the channel regions 42 is selectively activated by selectively energizing the lower wordline components 46. In the shown embodiment the horizontal regions 54 comprise thicknesses $X_3$ (only part of which is visible in FIGS. 2-4) and the projections 56 comprise thicknesses $X_4$ (only part of which is visible in FIGS. 2-4). The ratio of $X_4$ to $X_3$ may be any suitable value; for instance, in some embodiments $X_4$ may be greater than or equal to about double $X_3$, greater than or equal to about triple $X_3$, greater than or equal to about quadruple $X_3$, etc.

The thickness $X_1$ of the upper wordline component 44 may be the same or different than the thickness $X_3$ of the lower wordline component 46; and the thickness $X_2$ of the upper wordline component 44 may be the same or different than the thickness $X_4$ of the lower wordline component 46.

The upper wordline components 44 activate the first finFET access transistors 12a, and the lower wordline components 46 activate the second finFET access transistors 12b. The conductive lines 44 and 46 of the embodiment of FIGS. 1-4 are referred to as wordline components, rather than as wordlines, because the conductive lines 44 and 46 are utilized in tandem for operating access transistors in two different rows. Similarly, the lines $D_1$ and $D_2$ are referred to as digit line components because the lines $D_1$ and $D_2$ are utilized in tandem during operation of columns. In other words, wordlines are distinguished from wordline components in that wordlines are utilized for operation of entire rows of access transistors whereas wordline components are utilized in tandem for operation of two rows of access transistors that are on opposing sides of the wordline components; and digit lines are distinguished from digit line components in that digit lines are utilized during operation of entire columns, whereas digit line components are utilized in tandem for shared operation of a column.

The wordlines 46 do not overlap the heavily-doped regions 31/33 in the illustrated embodiment. In practice, there may be lightly-doped extension regions provided between the heavily-doped regions and the gates in this and other embodiments described herein. The lightly-doped extension regions may be implanted regions and/or may form operationally during operation of gated devices.

The combination of a first access transistor 12a with a charge-storage device (e.g., capacitor 43) forms a first memory cell 58a, with a charge state of the charge-storage device corresponding to a memory state of the memory cell. Similarly, the combination of a second access transistor 12b with a charge-storage device (e.g., capacitor 43) forms a second memory cell 58b. The memory cells 58a/58b are arranged in rows and columns across the memory array 10. The wordline components 44/46 extend along rows of the memory cells 58a/58b within the memory array 10. The digit line components $D_1/D_2$ extend along columns of the memory cells 58a/58b within the memory array 10; and laterally adjacent digit line components $D_1$ and $D_2$ together form digit line configurations 60 along the columns (the digit line configurations 60 are shown in dashed-line view in FIG. 1 in that they are above the plane of the FIG. 1 view; and each digit line configuration 60 includes a first line comprising digit line component $D_1$ and a second line comprising digit line component $D_2$, as shown relative to one of the digit line configurations 60). Each of the memory cells 58a/58b may be uniquely addressed with a digit line component and a wordline component. Each memory cell 58a/58b utilizes only one of the digit line components $D_1$ and $D_2$. Such is indicated in FIG. 1 with solid squares and dashed squares. Solid squares are provided around regions of the digit line components $D_1/D_2$ utilized by individual memory cells 58a/58b, and dashed squares are provided around regions of the digit line components $D_1/D_2$ not utilized by the individual memory cells 58a/58b.

In the embodiment of FIGS. 1-4, the digit line configurations 60 are substantially straight lines extending substantially orthogonally to the rows 20-24. In the shown embodiment, the rows 20-24 extend along the direction of axis 5, and the digit line configurations 60 extend along a direction of an axis 7 substantially orthogonal to the axis 5 (with axes 5 and 7 shown adjacent the top view of FIG. 1). The term "substantially straight" means straight to within reasonable tolerances of fabrication and measurement; and the term "substantially orthogonal" means orthogonal to within reasonable tolerances of fabrication and measurement.

In the embodiment of FIGS. 1-4, conductive shielding lines 62 are within the second-type gaps G2 (gaps 26, 28 and 30), as shown in FIG. 4. The conductive shielding lines 62 may comprise a same composition as the wordline components 44/46 in some embodiments, and may comprise different compositions than the wordline components 44/46 in other embodiments. For instance, in some embodiments the conductive shielding lines 62 may consist of conductively-doped semiconductor material, while the wordline components 44/46 may comprise metal.

In operation the conductive shielding lines 62 may provide electrical isolation between finFET rows on opposing sides of the shielding lines. The shielding lines 62 may be appropriately powered to provide the desired electrical isolation. For instance, in some embodiments the shielding lines 62 may be maintained at Vss or other suitable voltage, including, but not limited to, a ground voltage of about 0 V.

In the illustrated embodiment there is a single conductive shielding line 62 within the second-type gaps G2. The conductive shielding lines 62 are shown to overlap the bottom edges 37 of the trenches 36/38 within fins 14; and accordingly are shown to overlap the channel regions 40/42 (FIGS. 2 and 3) within the fins 14.

Figure 5:
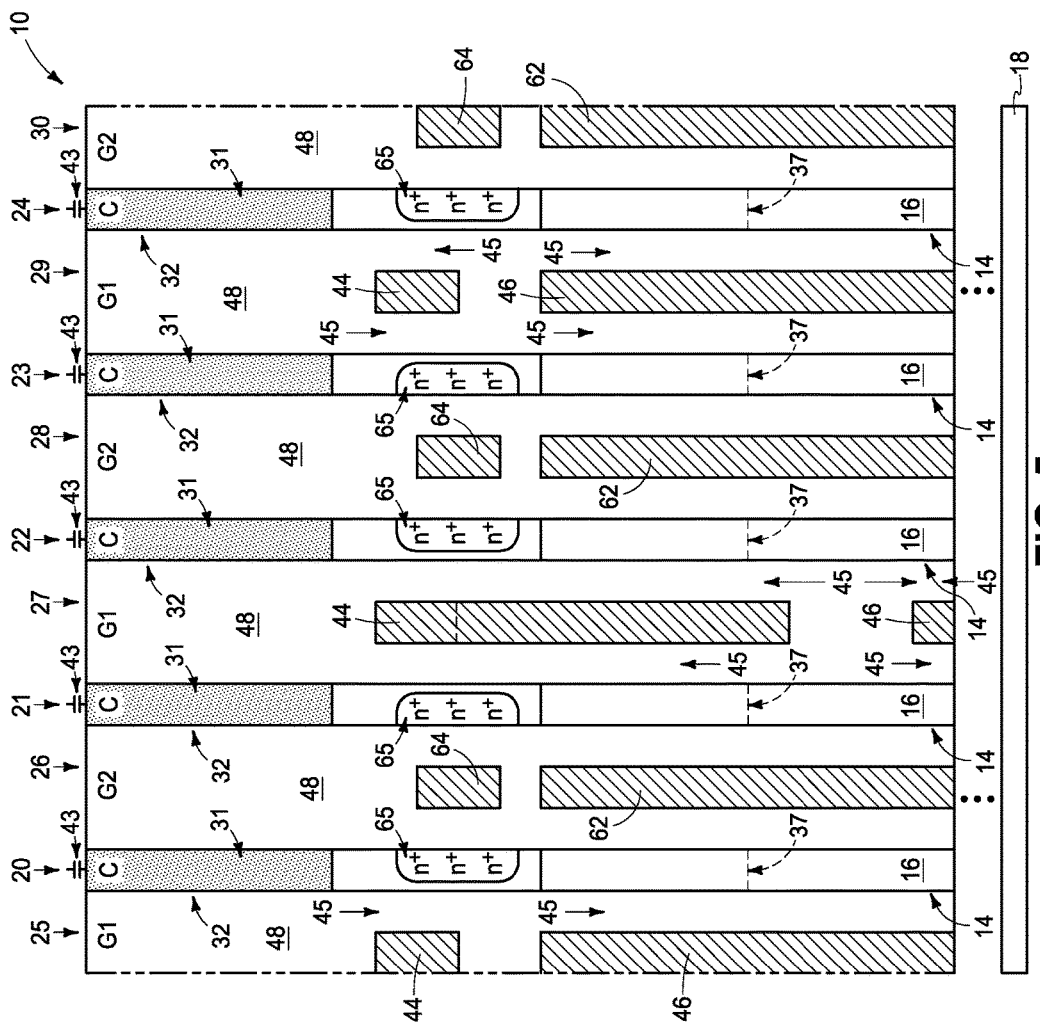
FIG. 5 is a view along the lines 4-4 of FIG. 1 of a configuration alternative to that shown in FIG. 4.
Figure 6:
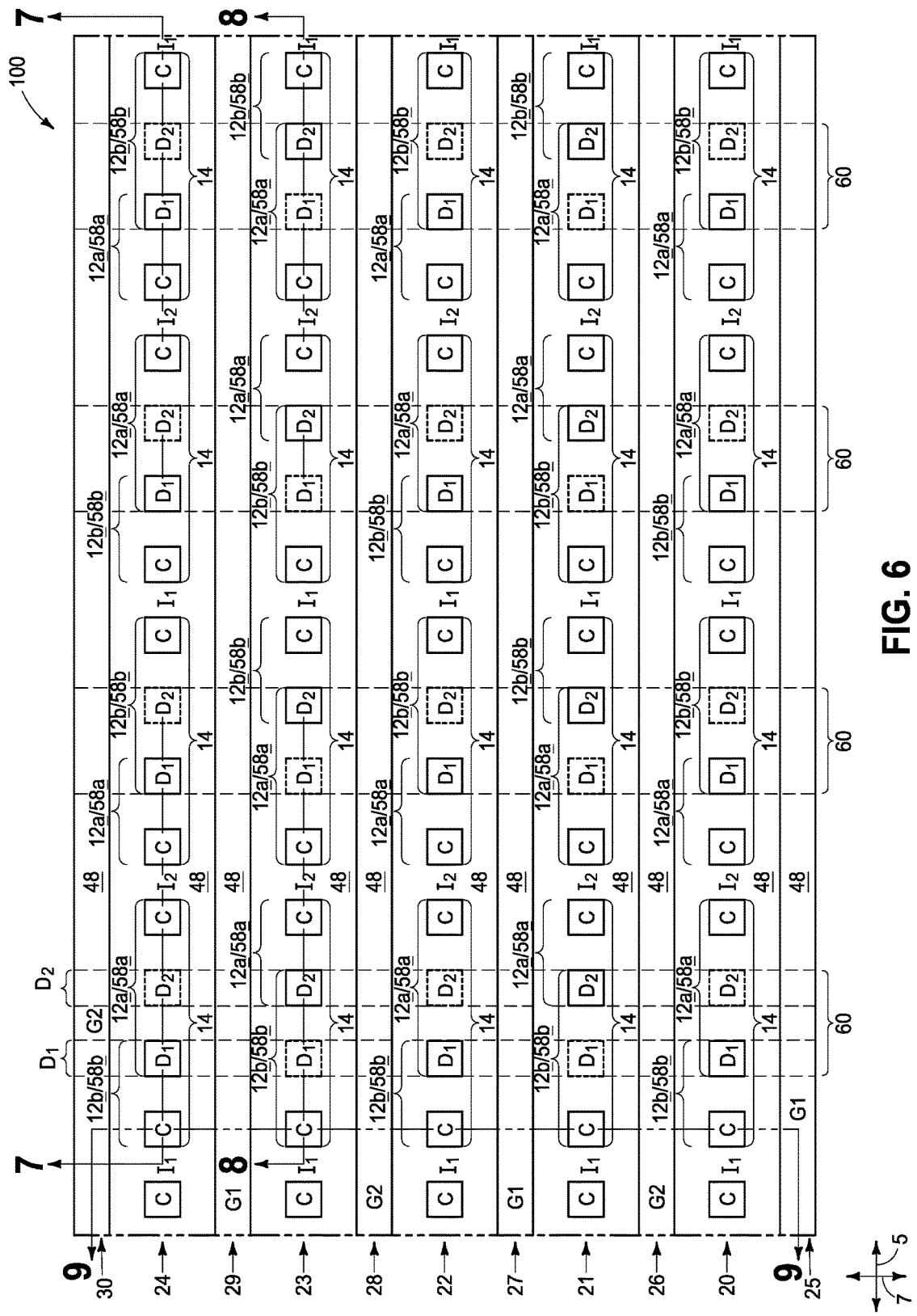
FIGS. 6-9 are a diagrammatic sectional top view and diagrammatic cross-sectional side views of a region of an example memory array. The view of FIG. 7 is along the lines 7-7 of FIG. 6; the view of FIG. 8 is along the lines 8-8 of FIG. 6; and the view of FIG. 9 is along the lines 9-9 of FIG. 6. The view of FIG. 6 is along the lines 6-6 of FIGS. 7-9.

FIG. 5 shows an embodiment similar to that of FIG. 4, but in which a pair of conductive lines 62 and 64 are provided within the second-type gaps G2. The conductive lines 64 are vertically stacked over the conductive lines 62. The transistors 12a/12b (FIGS. 1-3) may be operated somewhat differently in the embodiment of FIG. 5 than in that of FIG. 4. Specifically, the conductive lines 64 may be utilized to form dopant-enhanced regions 65 (diagrammatically illustrated in FIG. 5) along the adjacent pedestals 32/34 (with pedestals 32 being shown in FIG. 5, and pedestals 32/34 being shown in FIGS. 2 and 3). The dopant-enhanced regions 65 may enhance current flow along regions of the pedestals 32/34 during a duration in which channel regions 40/42 interconnecting such pedestals 32/34 are selectively activated with an adjacent wordline component 44/46. The dopant-enhanced regions 65 may enable the heavily-doped source/drain regions 31/33 to be formed shallower, as shown in FIG. 5 relative to regions 31. Although dopant-enhanced regions 65 are shown to be simultaneously formed along all of the rows 20-24, in other embodiments one or more of the conductive lines 64 may be selectively activated relative to others of the conductive lines 64 so that the dopant-enhanced regions 65 are selectively formed along only some of the rows 20-24 at any given time.

Referring to FIG. 1, in some embodiments row 23 may be considered to show a first arrangement of the memory cells 58a/58b along the row; and row 24 may be considered a second arrangement of the memory cells 58a/58b along the row. Specifically, row 23 has the active digit line component of the first memory cell 58b as $D_2$, and row 24 has the active digit line component of the first memory cell 58b as $D_1$. FIG. 1 shows an embodiment with a pattern in which adjacent rows 22 and 23 have the first arrangement, adjacent rows 20 and 21 have the second arrangement, etc. In other embodiments the first and second arrangements may alternate from one row to another in a pattern of the type described below with reference to FIG. 6 such that no two adjacent rows have the same arrangement as one another.

The embodiment of FIGS. 1-4 provides both of the wordline components 44 and 46 only within the first-type gaps G1 between the rows 20-24 of fins 14, and not within the second-type gaps G2. In other embodiments, one of the wordline components may be formed in a first-type gap G1 and the other formed in a second-type gap G2, as described with reference to an example memory array 100 of FIGS. 6-9.

The memory array 100 includes a plurality of fins 14 of semiconductor material 16. The fins are arranged in rows 20-24; with such rows extending along a direction of the axis 5 (the axis 5 is shown adjacent the top view of FIG. 6). The rows are spaced from one another by gaps 25-30. Such gaps alternate between the first-type gaps G1 and the second-type gaps G2.

The fins 14 extend upwardly from the substrate 18 (shown in FIGS. 7-9), and are spaced from one another by the regions 15 labeled $I_1$ or $I_2$.

Each fin 14 comprises the pair of first (outer) pedestals 32 and the second (inner) pedestal 34 between the first pedestals.

Each of the fins 14 comprises the first trough 36 between one of the first pedestals 32 and the second pedestal 34, and the second trough 38 between the other of the first pedestals 32 and the second pedestal 34. The troughs 36/38 have the bottom edges 37.

The first pedestals 32 contain the first source/drain regions 31, and the second pedestals 34 contain the second source/drain regions 33; with approximate locations of the first and second source/drain regions 31/33 being indicated by stippling. The first channel regions 40 and second channel regions 42 extend along the troughs 36 and 38; with some of the first channel regions 40 being associated with first troughs 36 and others with second troughs 38; and with some of the second channel regions 42 being associated with second troughs 38, and others with first troughs 36.

Each fin 14 comprises one of the first finFET transistors 12a and one of the second finFET transistors 12b.

The first source/drain regions 31 may be electrically coupled to charge-storage devices (e.g., capacitors), and are labeled with a C. The example capacitors are not shown in FIGS. 6-9 in order to simplify the drawings, but may be similar to the capacitors 43 diagrammatically illustrated in the cross-sectional views of FIGS. 2-4.

The second source/drain regions 33 are electrically coupled with the digit line components $D_1$ and $D_2$.

Figure 8:
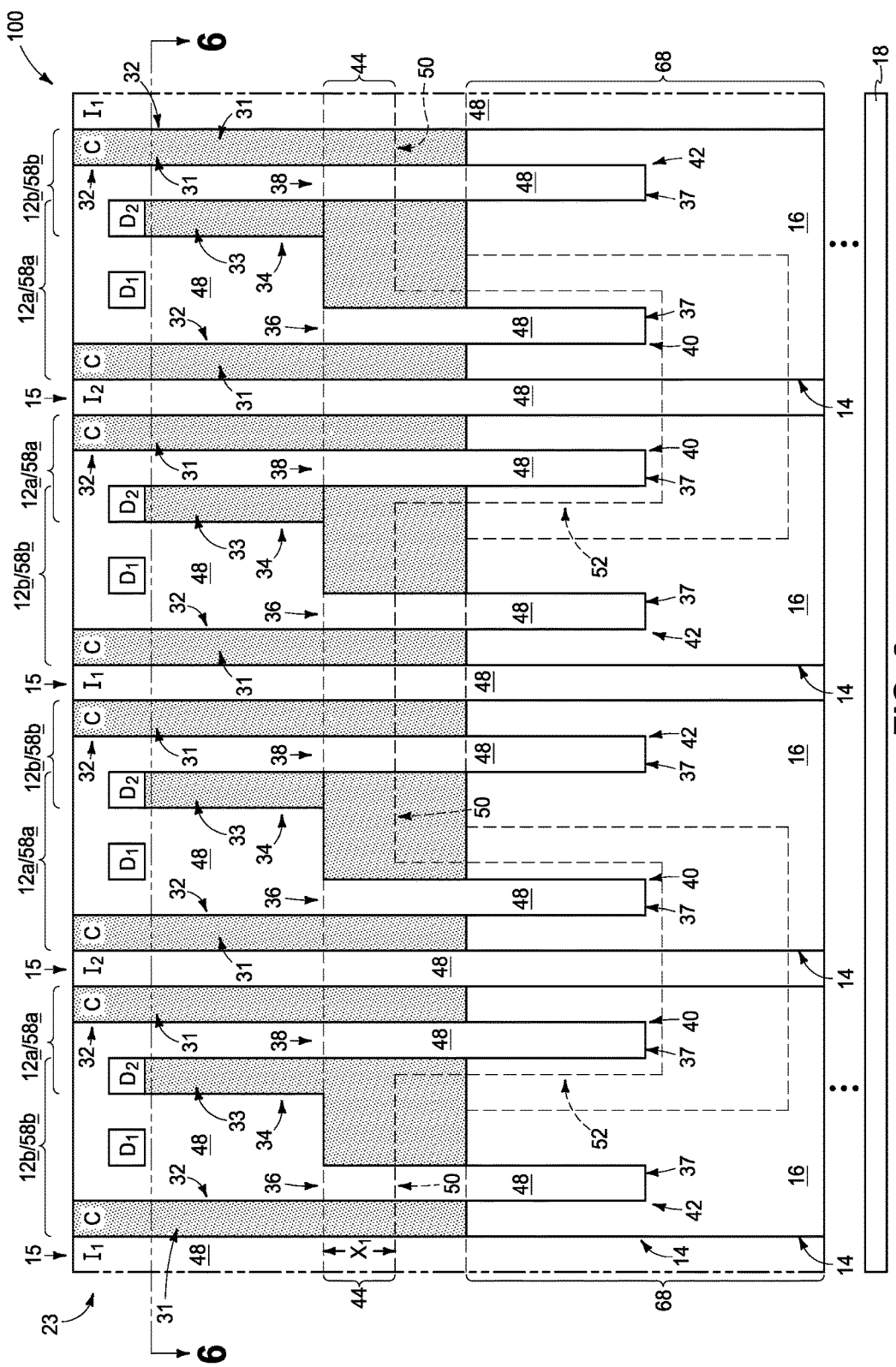
Figure 9:
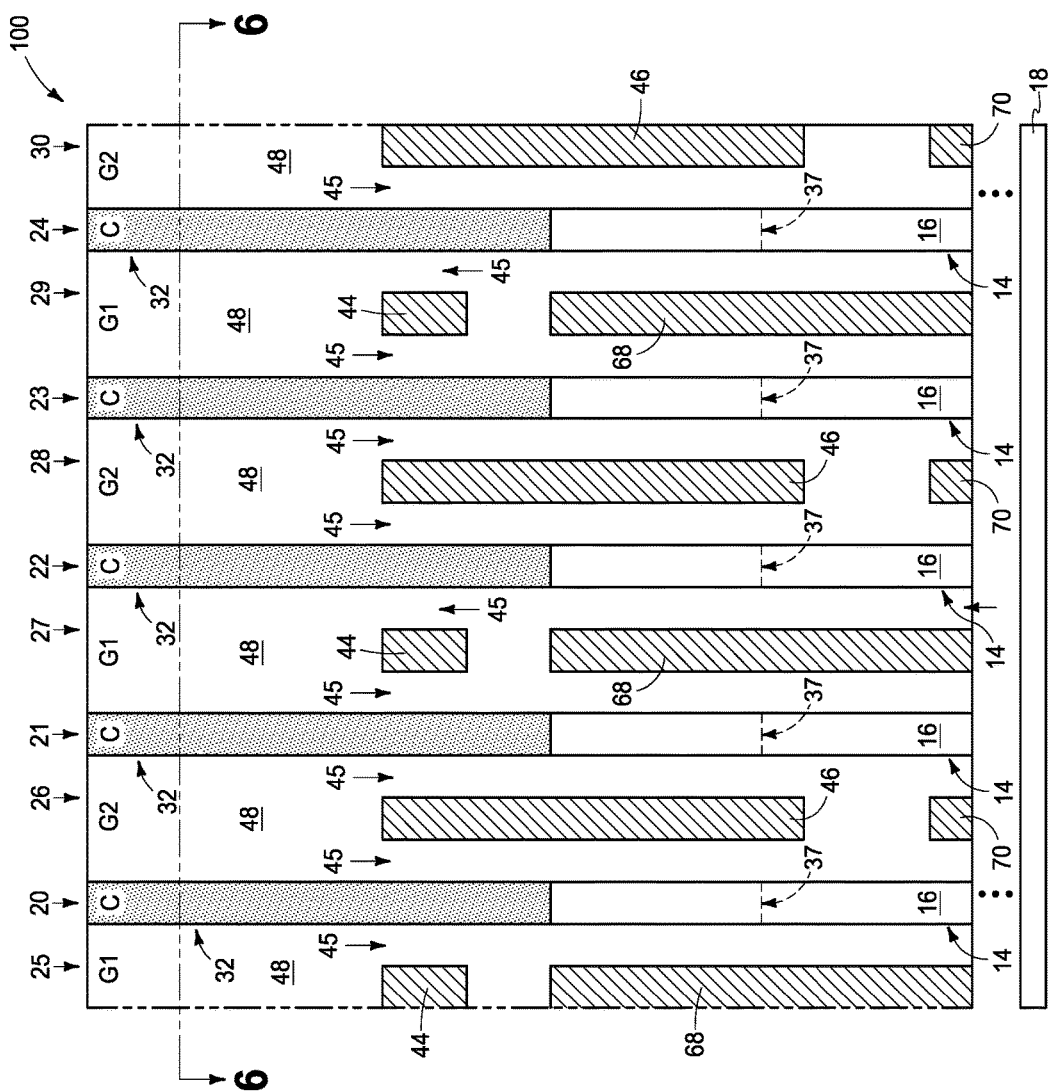

The first wordline components 44 are within the first-type gaps G1 (25/27/29); and the second wordline components 46 are within the second-type gaps G2 (26/28/30); as shown in FIG. 9. The first wordline components are over first conductive lines 68 and the second wordline components 46 are over second conductive lines 70. The wordline components 44/46 extend along sidewalls of the fins 14, and are spaced from such sidewalls by the gate dielectric material 45. The wordline components 44/46 and gate dielectric 45 are shown in FIG. 9, and the wordline component 44 is also diagrammatically illustrated in FIGS. 7 and 8 with dashed-lines (i.e., phantom view). The wordline component 44 is out of the plane relative to the views of FIGS. 7 and 8 (specifically, is in front of the plane of the FIG. 7 view, and behind the plane of the FIG. 8 view). A first conductive line 68 is also shown in phantom view in FIGS. 7 and 8.

Figure 7:
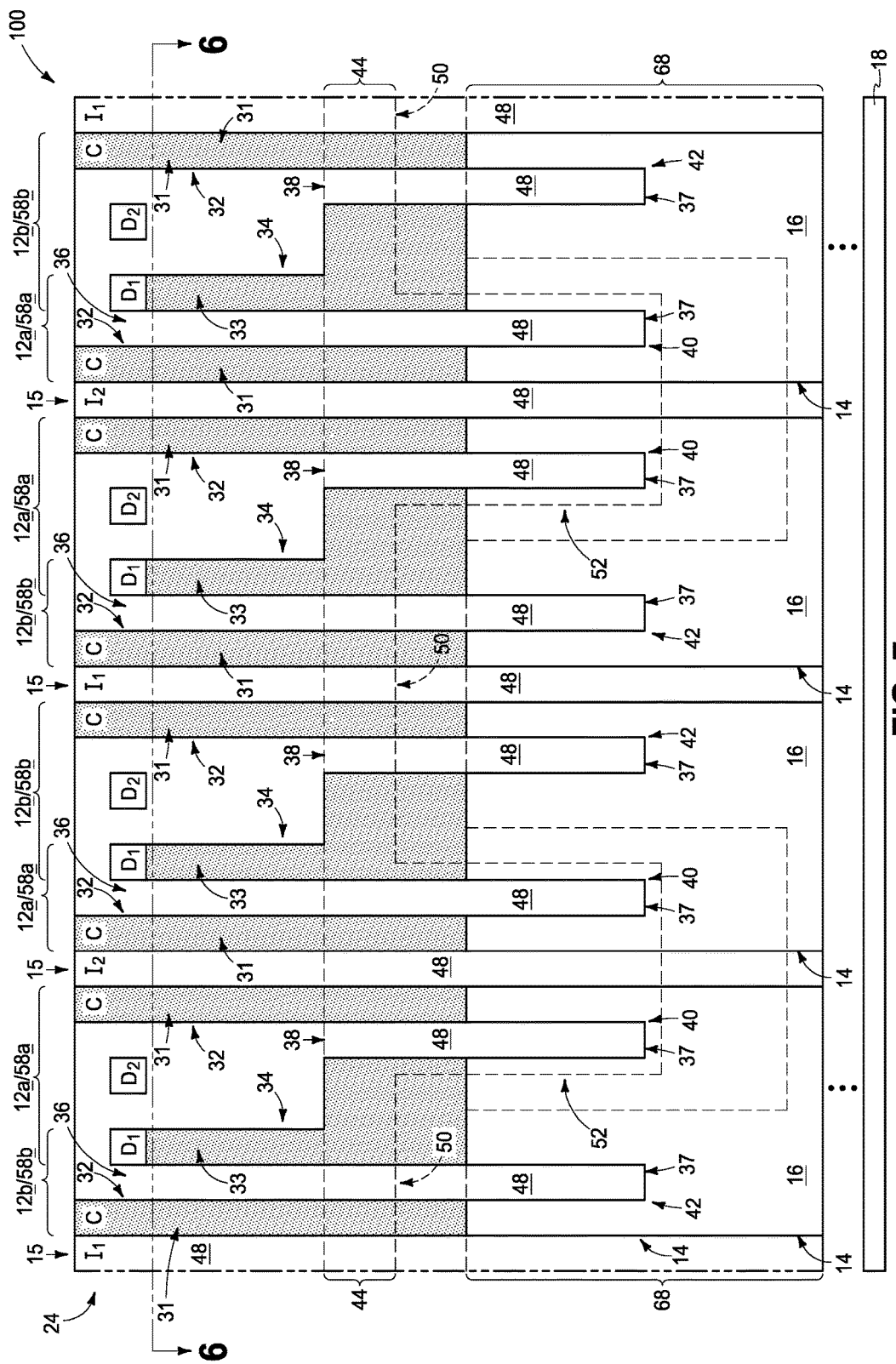

FIGS. 7-9 show that the first wordline components 44 comprise the horizontal regions 50 which are above the second channel regions 42, and too high to be utilized for gating the second channel regions. The first wordline components 44 also comprise downwardly-extending projections 52 which overlap the first channel regions 40 such that current flow along the channel regions 40 is selectively activated by selectively energizing the first wordline components 44.

The second wordline components 46 comprise a same shape as the first wordline components (with the second wordline components not being visible in the views of FIGS. 7 and 8); except that the downwardly projecting portions of the second wordline components 46 overlap the second channel regions 42 instead of the first channel regions 40. Thus the first wordline components 44 in gaps G1 and the second wordline components 46 in gaps G2 are operated in tandem to address the first and second channel regions 40/42 along a row of fins (e.g., one of the rows 20-24).

The first and second conductive lines 68/70 may be utilized for suppressing noise along access transistors as wordline components 44/46 are utilized. For instance, the first conductive lines 68 may be utilized for suppressing noise along the access transistors 12b while the access transistors 12a are activated with first wordline components 44, and similarly the conductive lines 70 may be utilized for suppressing noise along the access transistors 12a while the access transistors 12b are activated with the second wordline components 46.

The first and second wordline components 44/46 may comprise any suitable electrically conductive materials, such as, for example, one or more of various metals (e.g., titanium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The first wordline components 44 may comprise a same composition as the second wordline components 46 in some embodiments, and may comprise different compositions than the second wordline components 46 in other embodiments.

The first and second conductive lines 68/70 may comprise any suitable electrically conductive materials. In some embodiments the first and second conductive lines 68/70 comprise conductively-doped semiconductor material (e.g., conductively-doped silicon), and the first and second wordline components 44/46 comprise metal. The metal may enable rapid switching along the wordline components 44/46. The semiconductor material of the first and second conductive lines 68/70 may simplify fabrication in that it may be easier to form metal-containing material of the wordline components 44/46 over conductive lines comprising semiconductor material than over conductive lines comprising metal. Specifically, over-oxidation of metal-containing conductive lines 68/70 during a fabrication process may be more likely and thus more problematic than is overoxidation of semiconductor material-containing lines 68/70.

The first wordline components 44 activate the first finFET access transistors 12a, and accordingly access the first memory cells 58a. The second wordline components 46 activate the second finFET access transistors 12b, and accordingly access the second memory cells 58b.

The embodiment of FIGS. 6-9 utilizes fins 14 which each comprise two channel regions 40/42. An alternative embodiment may utilize fins 14 comprising only a single channel region 40. An example of such alternative embodiment is described with reference to a memory array 200 in FIGS. 10-13.

The memory array 200 includes a plurality of fins 14 of semiconductor material 16. The fins are arranged in rows 20-24; with such rows extending along a direction of the axis 5 (the axis 5 is shown adjacent the top view of FIG. 10). The rows are spaced from one another by gaps 25-30. Such gaps alternate between the first-type gaps G1 and the second-type gaps G2.

The fins 14 extend upwardly from the substrate 18 (shown in FIGS. 11-13), and are spaced from one another by the regions 15 comprising the insulative material 48.

Each fin 14 comprises a first pedestal 32, a second pedestal 34, and a trough 36 between the first and second pedestals 32/34. The troughs 36 have the bottom edges 37.

The first pedestals 32 contain the first source/drain regions 31, and the second pedestals 34 contain the second source/drain regions 33; with approximate locations of the first and second source/drain regions 31/33 being indicated by stippling. The first channel regions 40 and second channel regions 42 extend along the troughs 36.

The first channel regions 40 are comprised by the first finFET transistors 12a, and the second channel regions 42 are comprised by the second finFET transistors 12b.

The first source/drain regions 31 may be electrically coupled to charge-storage devices (e.g., capacitors), and are labeled with a C. In some embodiments the charge-storage devices may comprise capacitors 43 of the type diagrammatically illustrated in the cross-sectional views of FIGS. 2-4.

Figure 10:
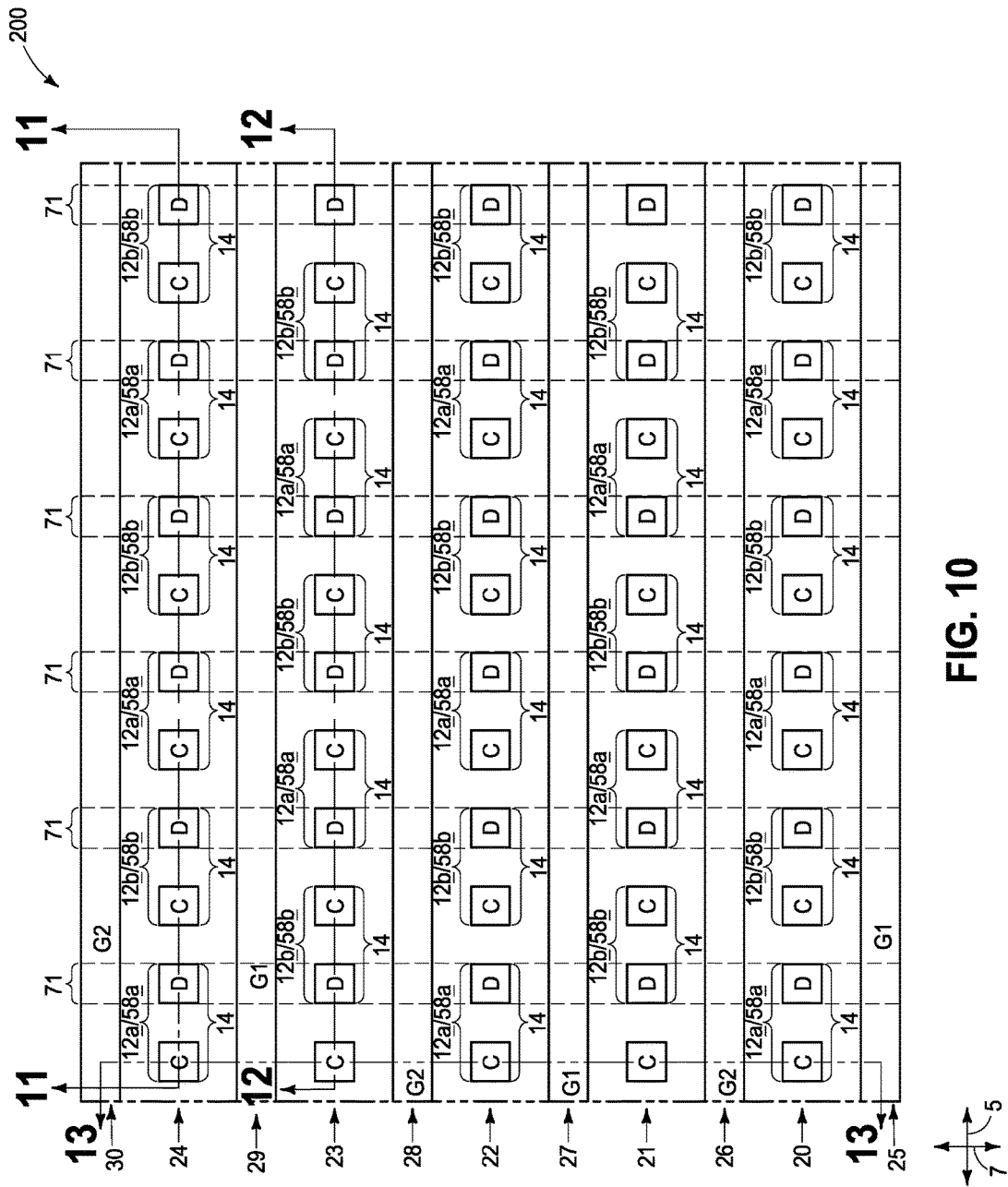
FIGS. 10-13 are a diagrammatic top view and diagrammatic cross-sectional side views of a region of an example memory array. The view of FIG. 11 is along the lines 11-11 of FIG. 10, the view of FIG. 12 is along the lines 12-12 of FIG. 10; and the view of FIG. 13 is along the lines 13-13 of FIG. 10. The view of FIG. 10 is along the lines 10-10 of FIGS. 11-13.

The second source/drain regions 33 are electrically coupled with digit lines 71, and are labeled with a D; with example digit lines 71 being illustrated in dashed-line view in FIG. 10 (the digit lines 71 are above the plane of the FIG. 10 view).

Figure 13:
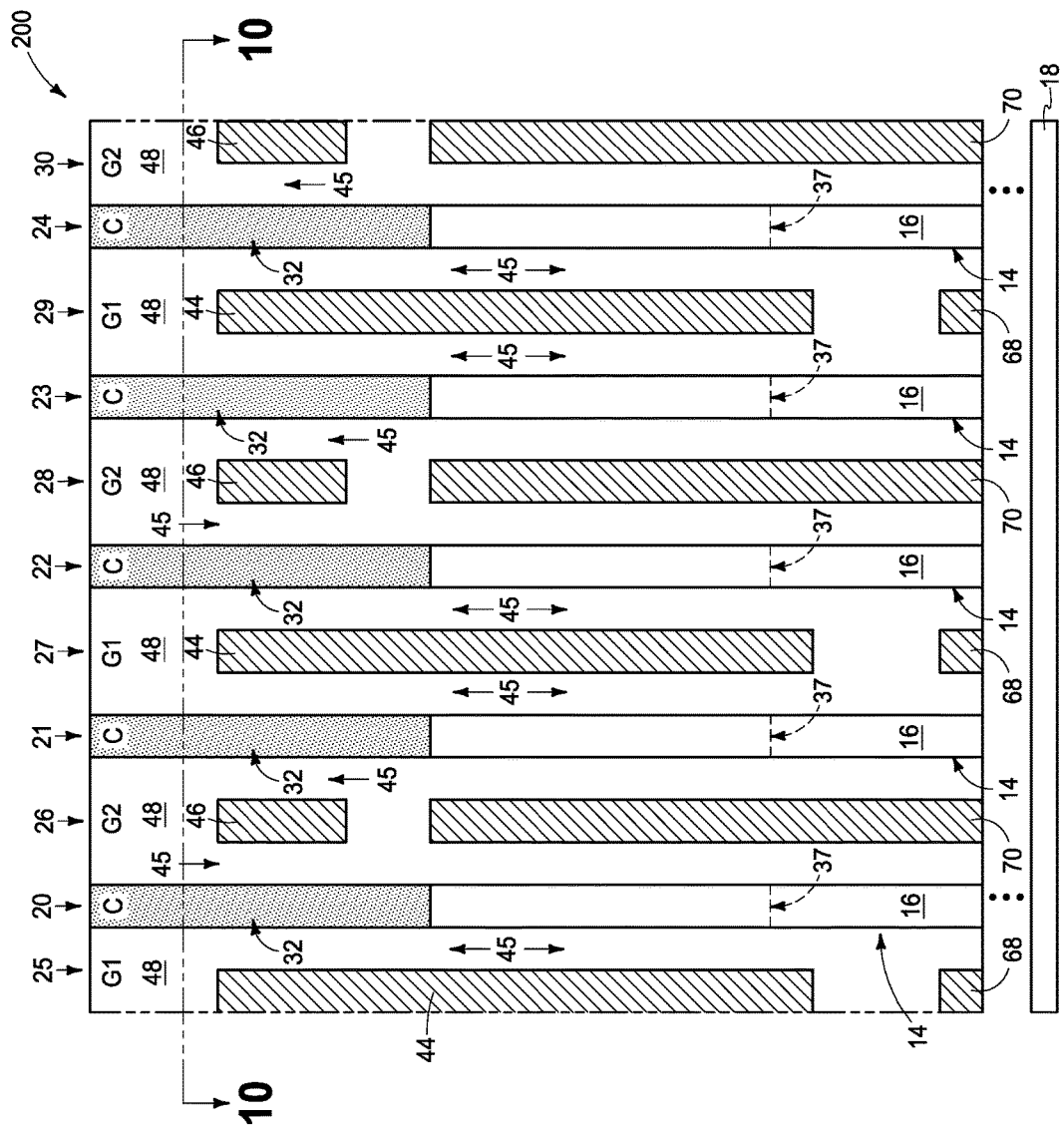

The first wordline components 44 are within the first-type gaps G1 (25/27/29); and the second wordline components 46 are within the first-type gaps G2 (26/28/30); as shown in FIG. 13.

The first wordline components 44 are over the first conductive lines 68 and the second wordline components 46 are over the second conductive lines 70. The wordline components 44/46 extend along sidewalls of the fins 14, and are spaced from such sidewalls by the gate dielectric material 45.

The wordline components 44/46 and gate dielectric 45 are shown in FIG. 13. The wordline component 44 is also diagrammatically illustrated in FIGS. 11 and 12 with dashed-lines (i.e., phantom view) since the wordline component 44 is out of the plane relative to the views of FIGS. 11 and 12 (and specifically the wordline component 44 is in front of the plane of the FIG. 11 view, and behind the plane of the FIG. 12 view).

The first wordline components 44 comprise the horizontal regions 50 which are above the second channel regions 42, and too high to be utilized for gating the second channel regions. The first wordline components 44 also comprise downwardly-extending projections 52 which overlap the first channel regions 40 such that current flow along the channel regions 40 is selectively activated by selectively energizing the first wordline components 44. The second wordline components 46 comprise a same shape as the first wordline components (with the second wordline components not being visible in the views of FIGS. 11 and 12); except that the downwardly projecting portions of the second wordline components 46 overlap the second channel regions 42 instead of the first channel regions 40. Thus the first wordline components 44 in gaps G1 and the second wordline components 46 in gaps G2 are operated in tandem to address the first and second channel regions 40/42 along a row of fins (e.g., one of the rows 20-24).

The first and second conductive lines 68/70 may be utilized for suppressing noise along access the transistors 12a/12b as the wordline components 44/46 are utilized. For instance, the first conductive lines 68 may be utilized for suppressing noise along access transistors 12b while the access transistors 12a are activated with the first wordline components 44; and similarly the second conductive lines 70 may be utilized for suppressing noise along access transistors 12a while the access transistors 12b are activated with the second wordline components 46.

The first and second wordline components 44/46 may comprise any suitable electrically conductive materials, such as, for example, one or more of various metals (e.g., titanium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The first wordline components 44 may comprise a same composition as the second wordline components 46 in some embodiments, and may comprise different compositions than the second wordline components 46 in other embodiments.

The first and second conductive lines 68/70 may comprise any suitable electrically conductive materials. In some embodiments, the first and second conductive lines 68/70 comprise conductively-doped semiconductor material (e.g., conductively-doped silicon) while the first and second wordline components 44/46 comprise metal.

The first wordline components 44 activate the first finFET access transistors 12a, and accordingly access the first memory cells 58a. The second wordline components 46 activate the second finFET access transistors 12b, and accordingly access the second memory cells 58b.

Figure 11:
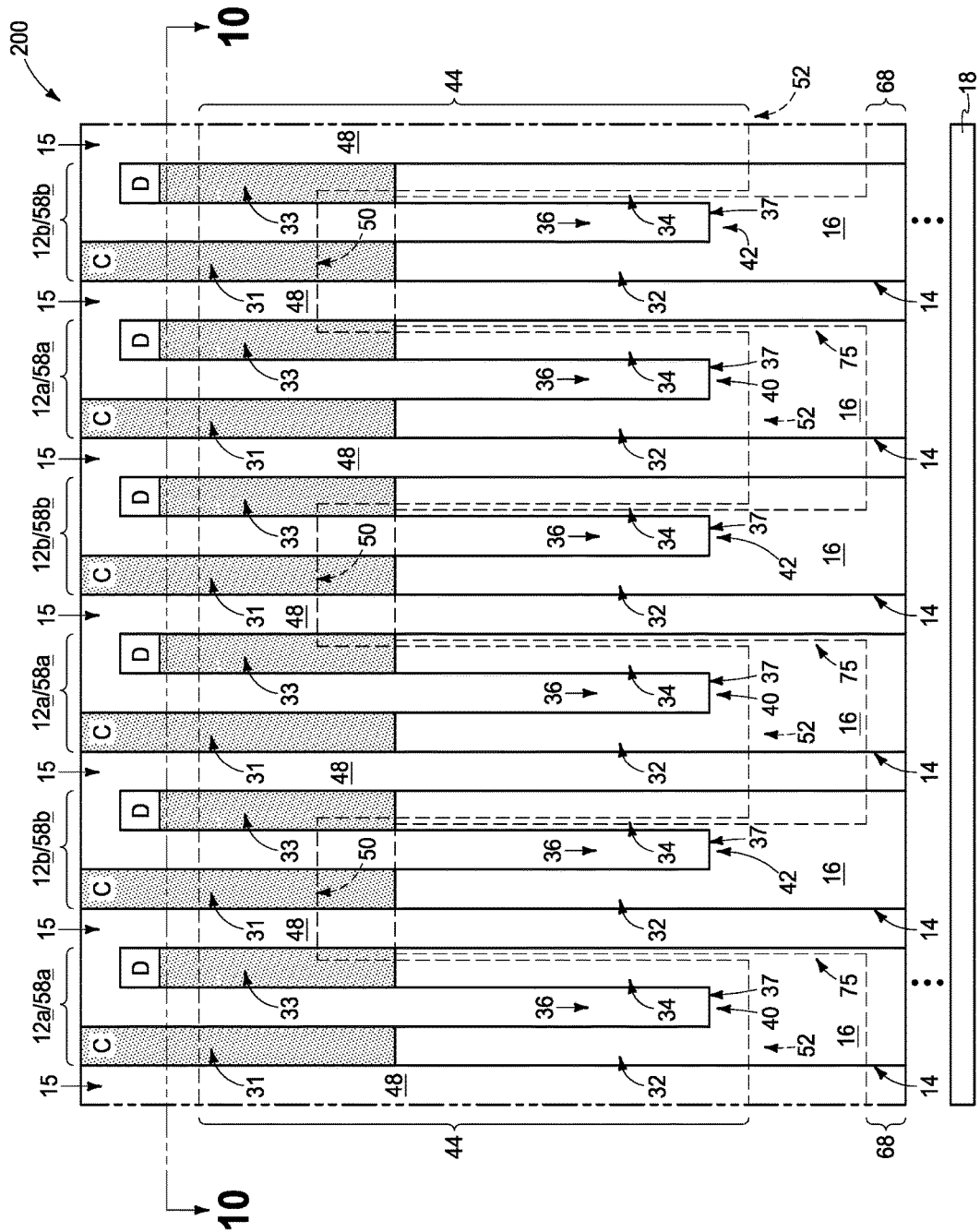
Figure 11A:
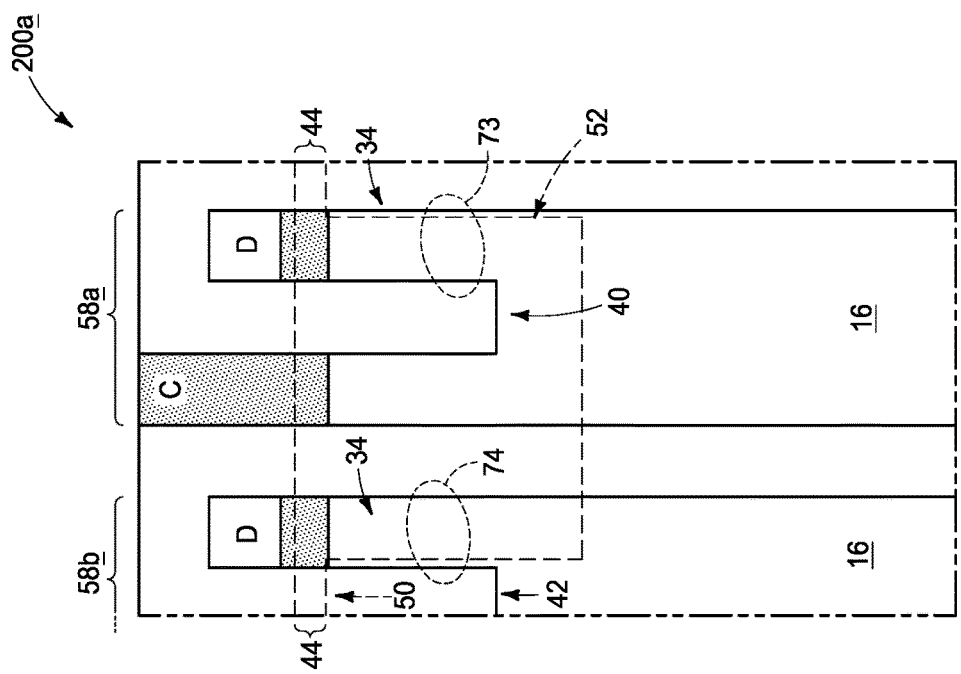
FIG. 11A is an expanded region of an example memory array analogous to that of FIGS. 10-13.

A possible problem that may occur with the embodiment of FIGS. 10-13 is illustrated in FIG. 11A, which shows an expanded region of a memory array 200a analogous to the memory array 200 described with reference to FIGS. 10-11 (FIG. 11A is shown with different scaling than FIGS. 10-13 to enable particular regions of FIG. 11A to be emphasized). The expanded region shows a memory cell 58a, and an adjacent memory cell 58b. For purposes of the discussion that follows, the memory cell 58a may be referred to as a first memory cell, and the pedestal 34 within the memory cell 58a may be referred to as a digit line interconnect of the first memory cell. Analogously, the memory cell 58b may be referred to as a second memory cell, and the pedestal 34 within the memory cell 58b may be referred to as a digit line interconnect of the second memory cell.

The vertical projection 52 of wordline component 44 overlaps the channel region 40 of memory cell 58a, as desired. Accordingly, the vertical projection 52 overlaps a portion of the digit line interconnect 34 within the first memory cell 58a, as is diagrammatically illustrated with a first overlap region 73. The problem may occur in that the vertical projection 52 also overlaps the digit line interconnect 34 within the adjacent second memory cell 58b, as is diagrammatically illustrated with a second overlap region 74. The vertical projection 52 does not overlap enough of the channel region 42 of the second memory cell 58b to activate the second memory cell. However, the overlap with a portion of the digit line interconnect 34 within the second memory cell 58b may undesirably disturb a memory state stored within the second memory cell 58b during access of the memory cell 58a. Such problem may correspond to a row-hammer disturbance problem in some applications.

Figure 14:
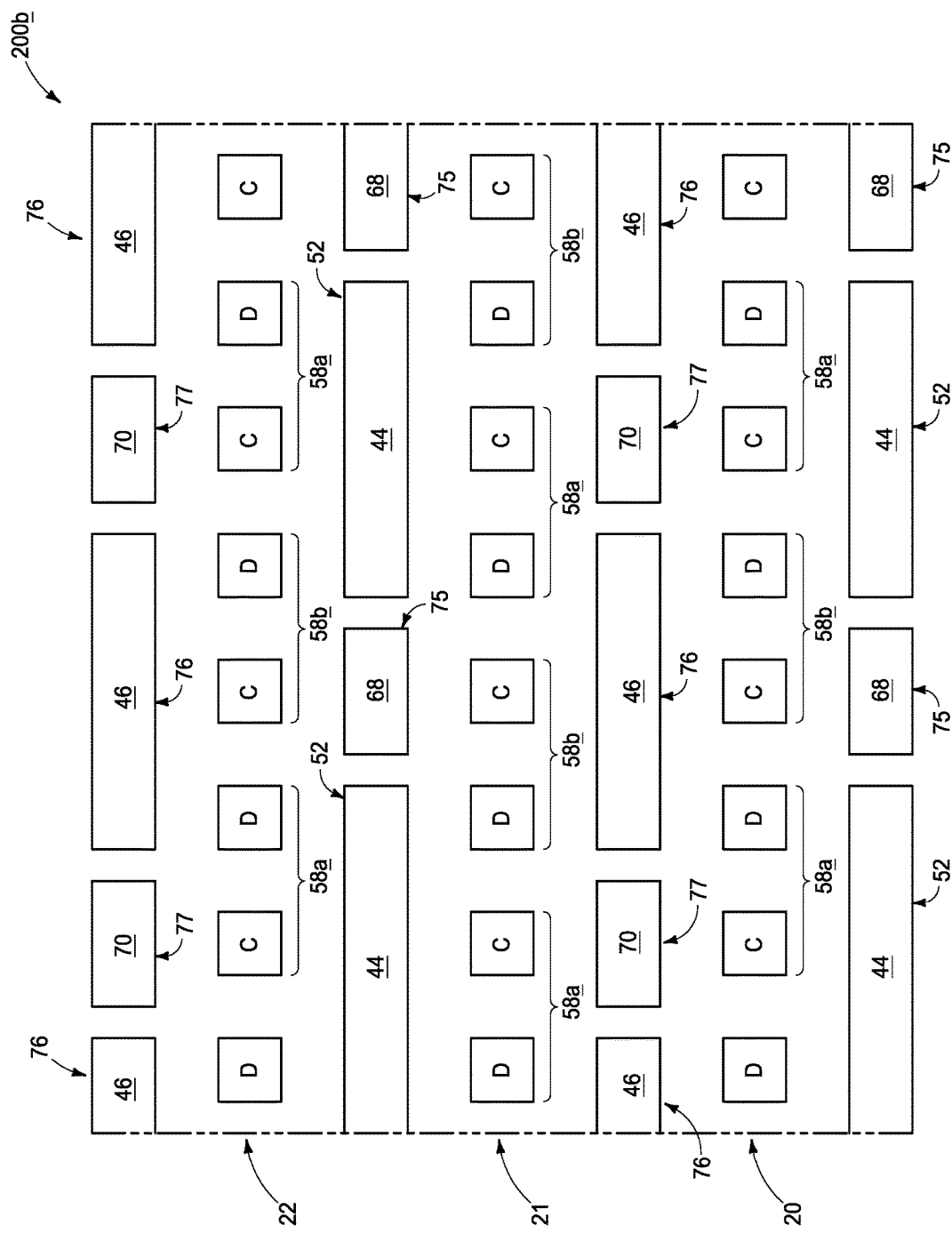
FIG. 14 is a top view of the memory array of FIG. 10 illustrating example operational aspects.

FIG. 14 diagrammatically illustrates a portion of the memory array 200a showing a method which may be utilized to alleviate or prevent the problem described with reference to FIG. 11A. Specifically, FIG. 14 shows a plurality of first memory cells 58a alternating with second memory cells 58b along rows 20-22. Portions of the first and second wordline components 44 and 46 are shown along the rows, as are portions of the first and second conductive lines 68 and 70.

Figure 12:
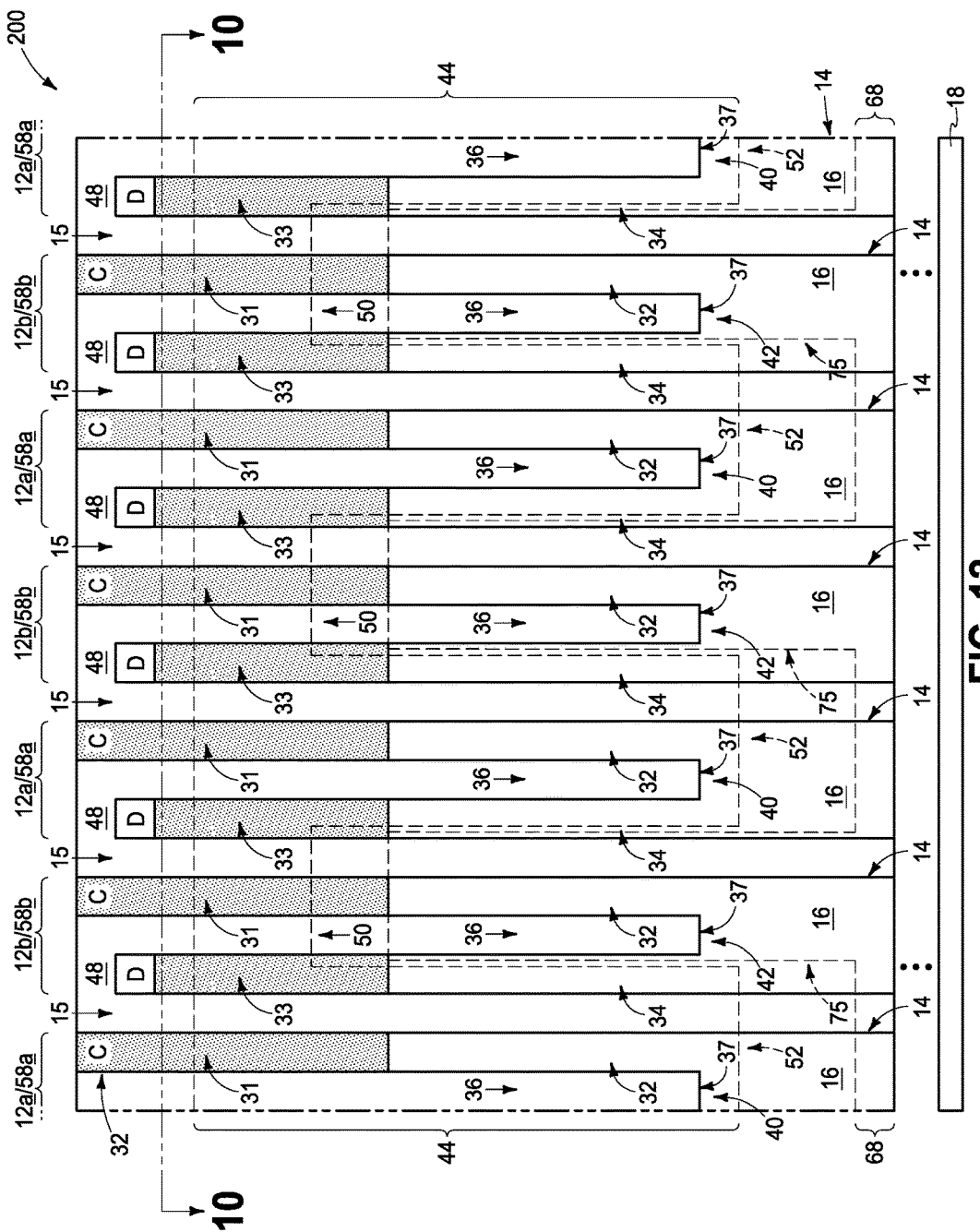

The illustrated portions of the first wordline components 44 diagrammatically illustrate the vertical projections 52, and the illustrated portions of the conductive lines 68 diagrammatically illustrate upwardly-extending vertical portions 75 (which are also shown in FIGS. 11 and 12 as being between the downwardly-extending portions 52 of the first wordline components 44).

The illustrated portions of the second wordline components 46 correspond to downwardly-extending vertical projections 76 analogous to the projections 52 of the first conductive wordline components 44; and the illustrated portions of the conductive lines 70 correspond to upwardly-extending vertical portions 77 analogous to the upwardly-extending vertical projections 75 of conductive lines 68.

Voltage along the conductive lines 68 and 70 may be utilized to provide a bias which alleviates the row-hammer disturbance described above with reference to FIG. 11A. For instance, in some applications the wordline components 44 and 46 may be utilized at voltages within a range of from about 0.4V to about −0.4V, and the conductive lines 68 and 70 may be maintained at voltages within a range of from about 0.6V to about −0.6V to provide a desired bias.

The various architectures described above may be fabricated with any suitable methodology. An advantage of the memory arrays described herein may be that such can be readily fabricated utilizing masks and spacers to align various structures. FIGS. 15-25 illustrate methodology which may be utilized to align some of the structures within the arrays of FIGS. 1-9.

Figure 15:
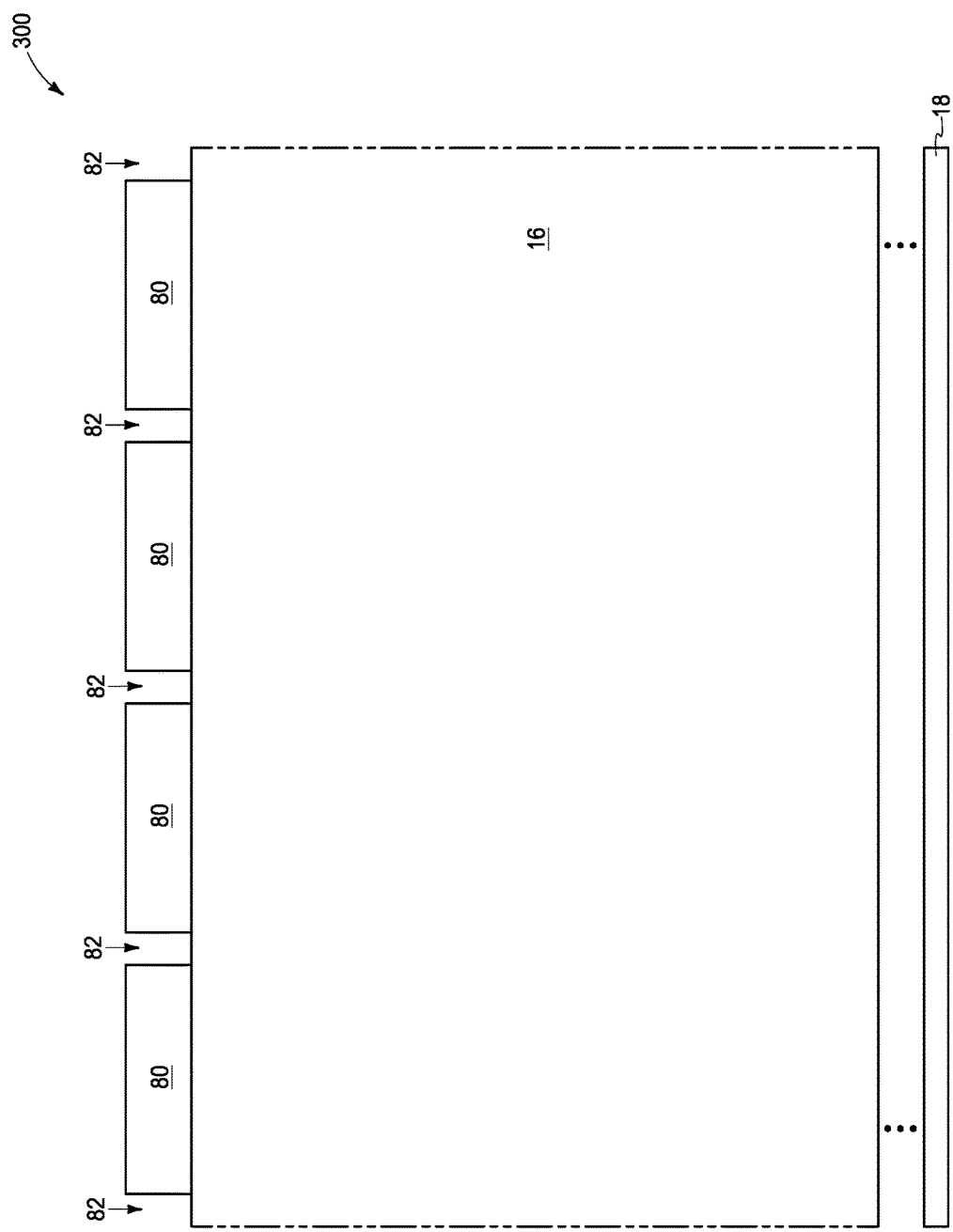
FIGS. 15-24 are diagrammatic cross-sectional side views of a region of construction at process stages of an example method for forming memory arrays of the types shown in FIGS. 1-9.

Referring to FIG. 15, a construction 300 comprises semiconductor material 16 supported over a base 18. Masking material 80 is provided over the semiconductor material 16, and patterned to have a plurality of gaps 82 extending therethrough. The masking material may comprise any suitable material, including, for example, one or more of photoresist, silicon nitride, silicon oxide, etc.

Figure 16:
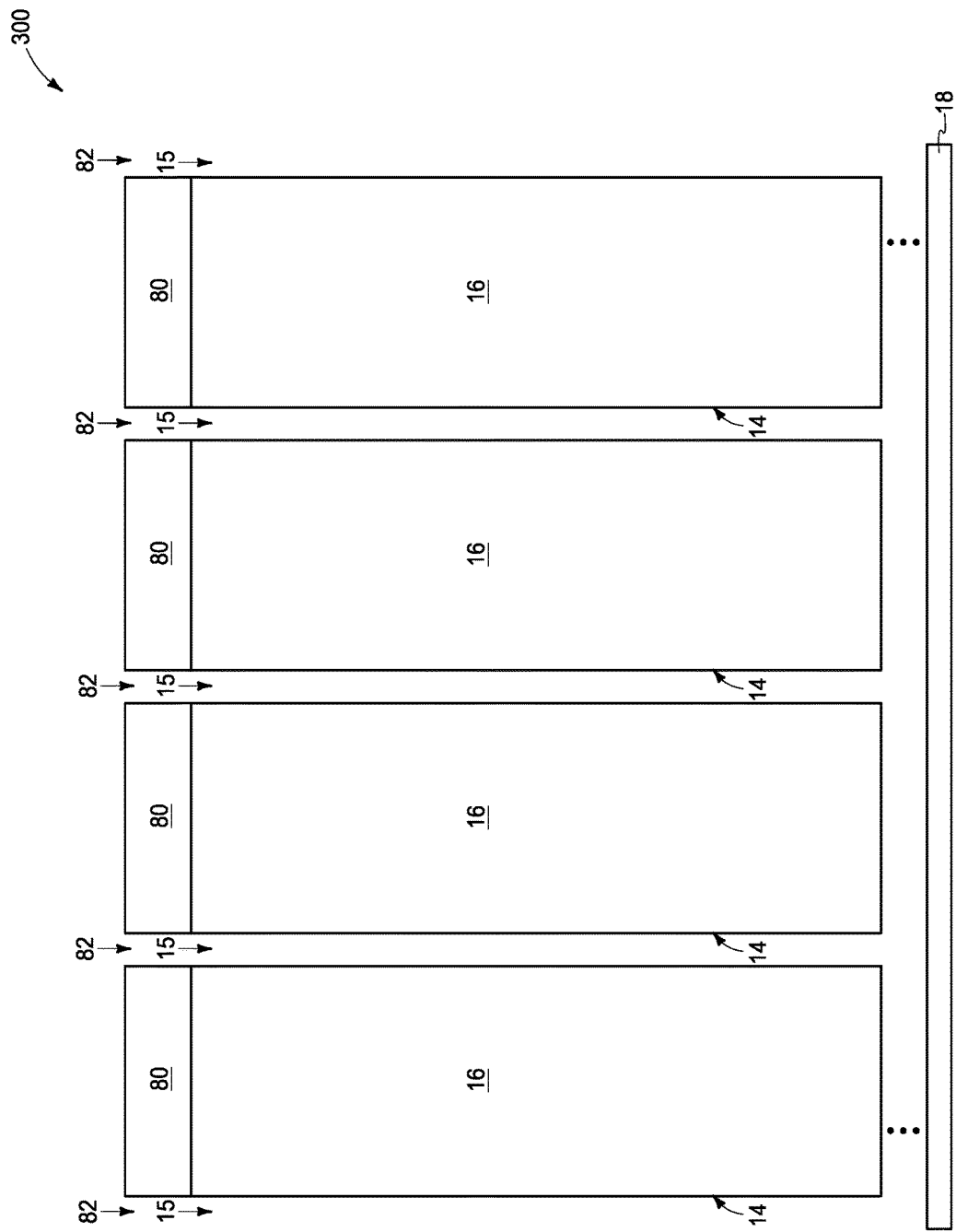

Referring to FIG. 16, the gaps 82 are extended into the semiconductor material 16 to form a plurality of the deep trenches 15 extending into the semiconductor material 16, and to thereby pattern the material 16 into a plurality of fins 14.

Figure 17:
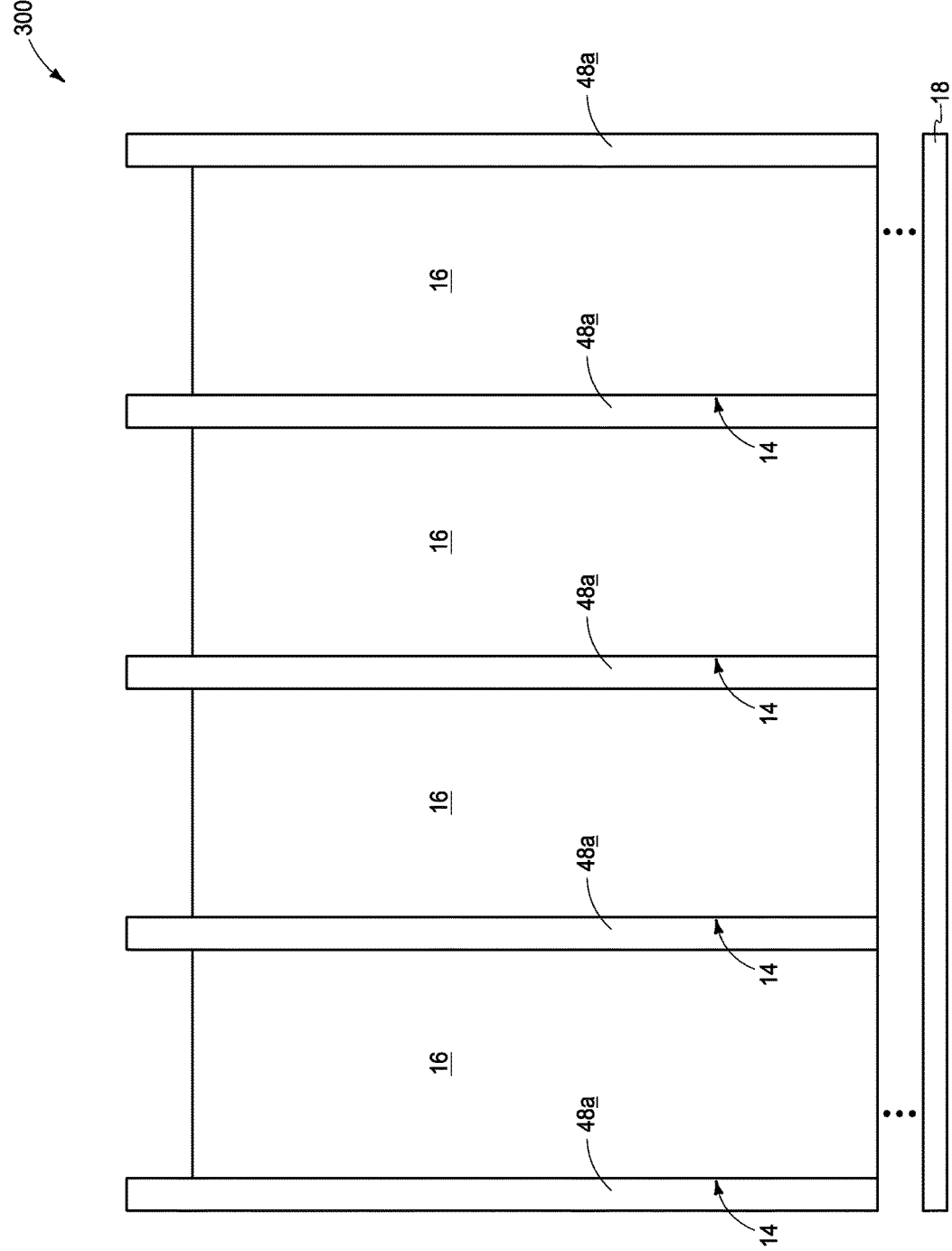

Referring to FIG. 17, insulative material 48a is formed within the deep trenches 15 (FIG. 16), and the masking material 80 (FIG. 16) is removed.

Figure 18:
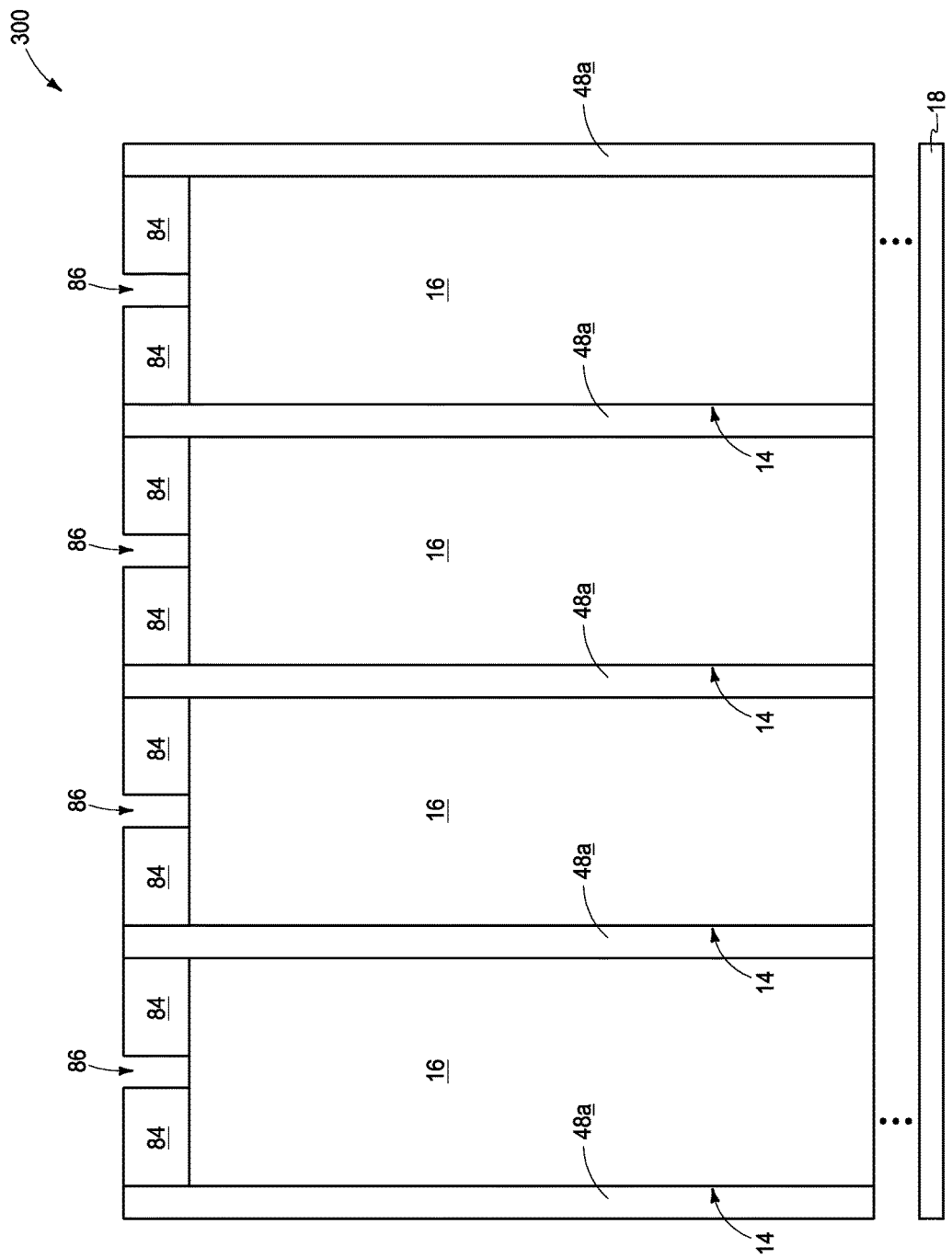

Referring to FIG. 18, spacers 84 are formed over semiconductor material 16 and aligned with the insulative material 48a within trenches 15. The spacers 84 pattern gaps 86 over semiconductor material 16. The spacers 84 may comprise any suitable material, including, for example, silicon dioxide, silicon nitride, etc.

Figure 19:
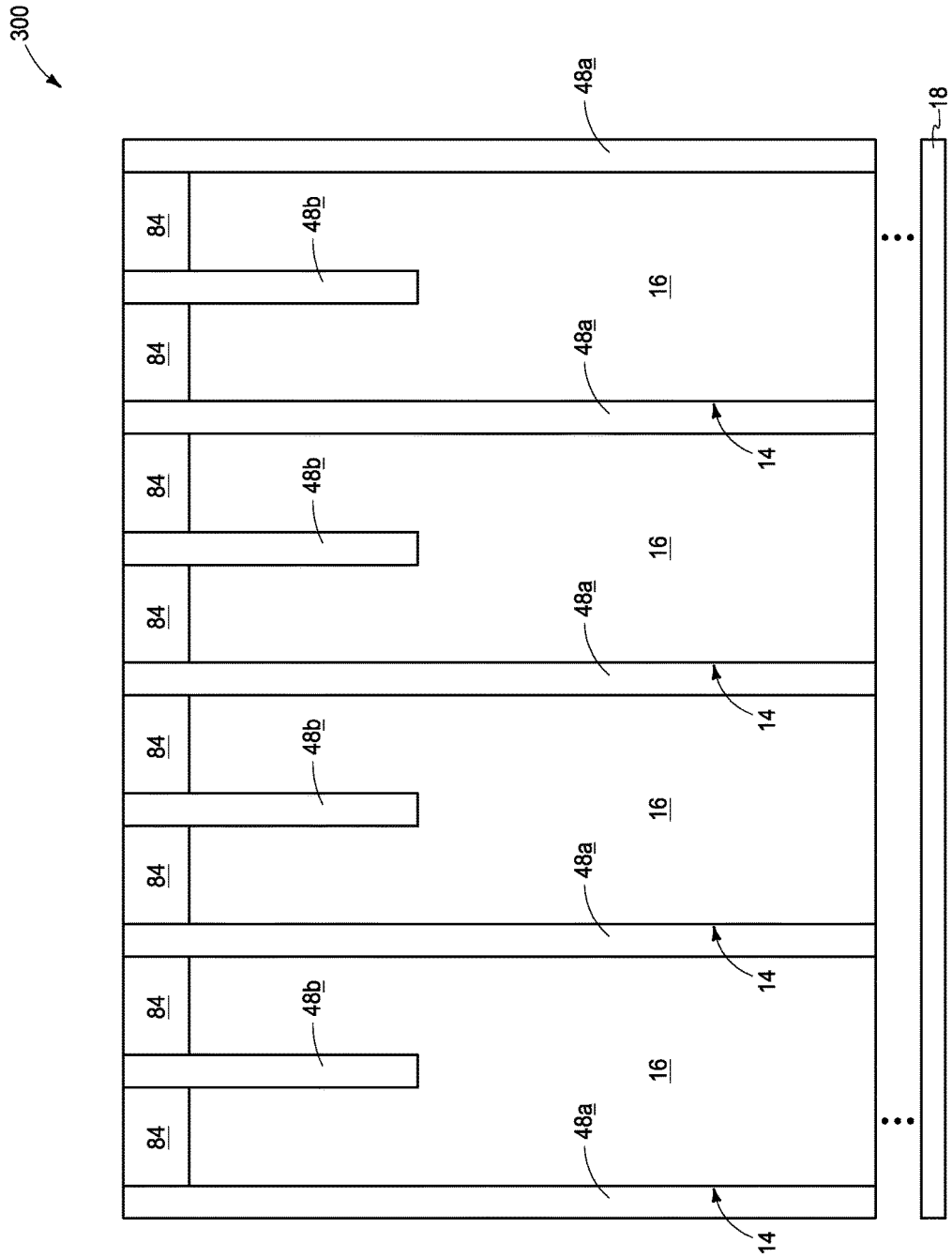

Referring to FIG. 19, the gaps 86 (FIG. 18) are extended into semiconductor material 16 and filled with insulative material 48b.

Figure 20:
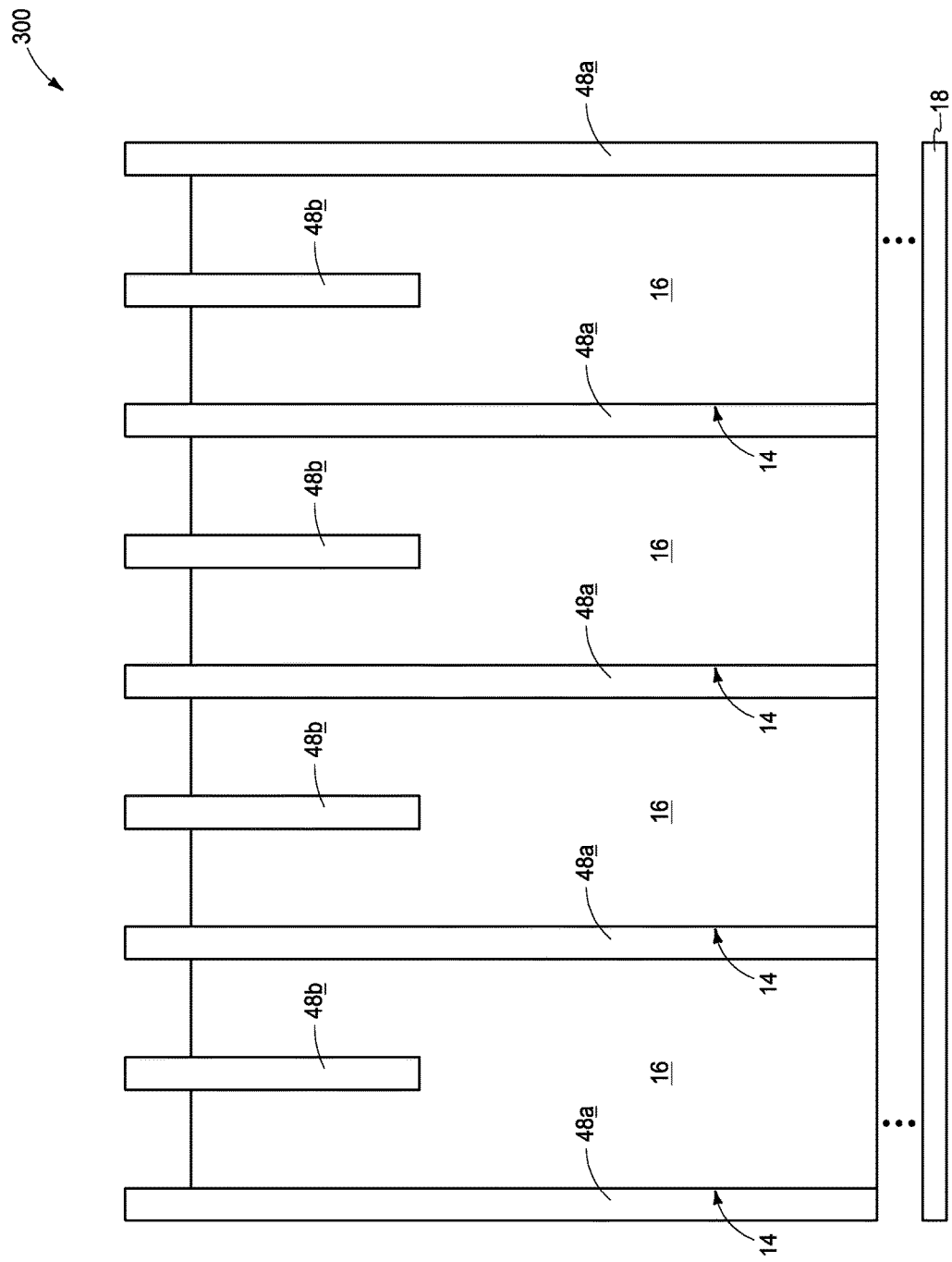

Referring to FIG. 20, the insulative spacers 84 (FIG. 19) are removed.

Figure 21:
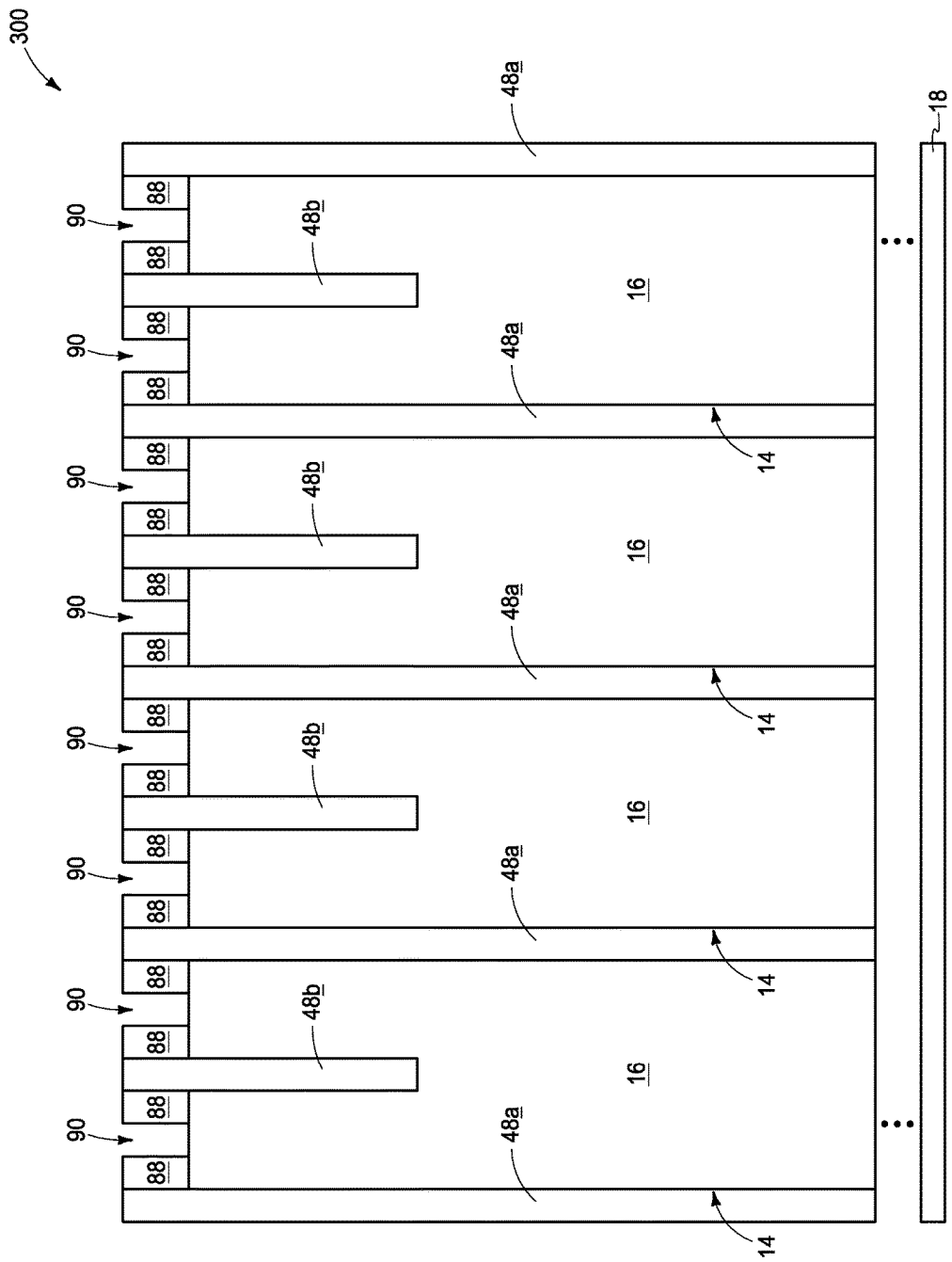

Referring to FIG. 21, spacers 88 are formed over semiconductor material 16 and aligned with insulative materials 48a and 48b. The spacers 88 pattern gaps 90 over semiconductor material 16. The spacers 88 may comprise any suitable material, including, for example, silicon dioxide, silicon nitride, etc.

Figure 22:
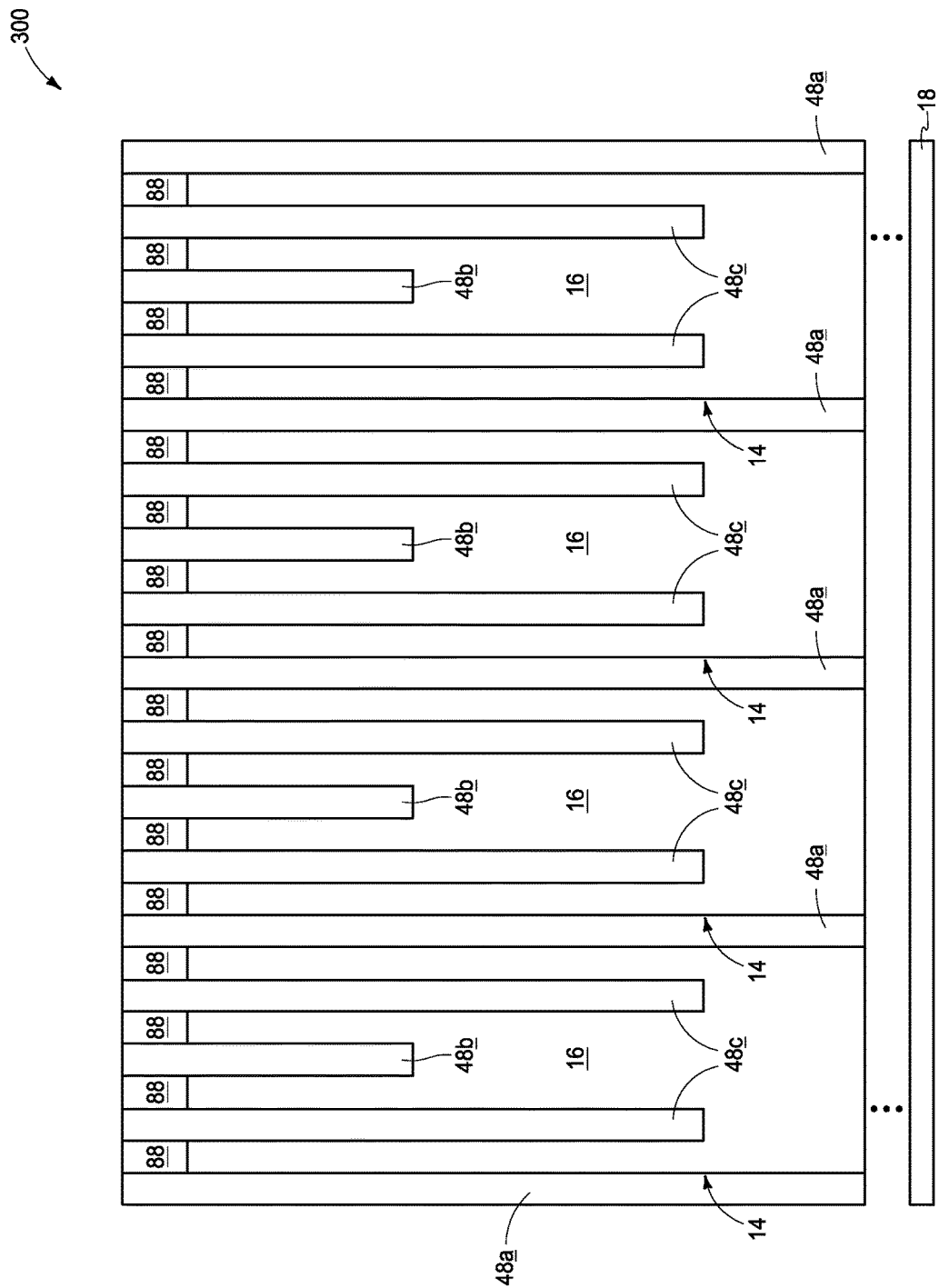

Referring to FIG. 22, the gaps 90 (FIG. 21) are extended into semiconductor material 16 and filled with insulative material 48c.

Figure 23:
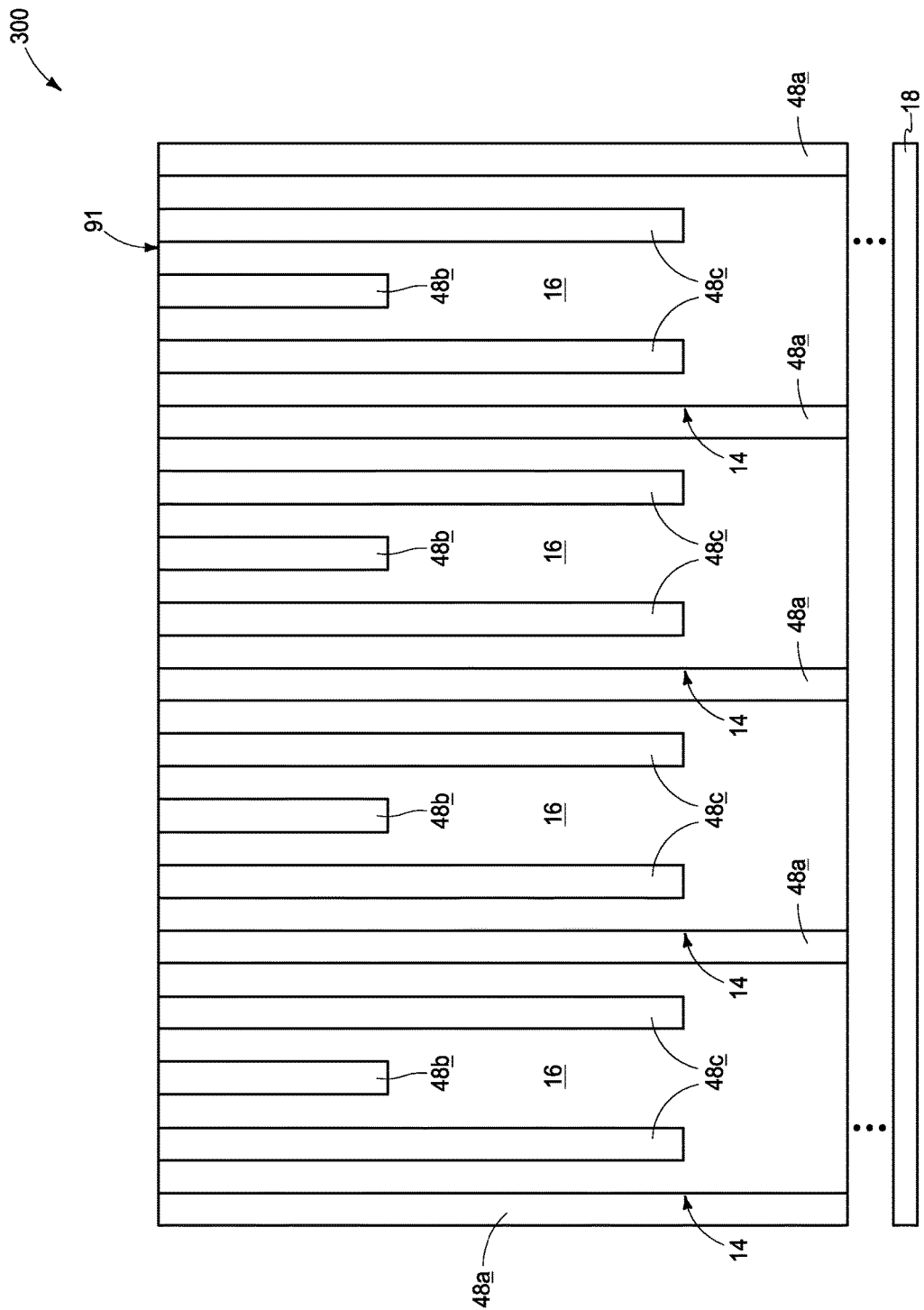

Referring to FIG. 23, construction 300 is subjected to planarization (for instance, chemical-mechanical polishing, CMP) to form the planarized upper surface 91.

Figure 24:
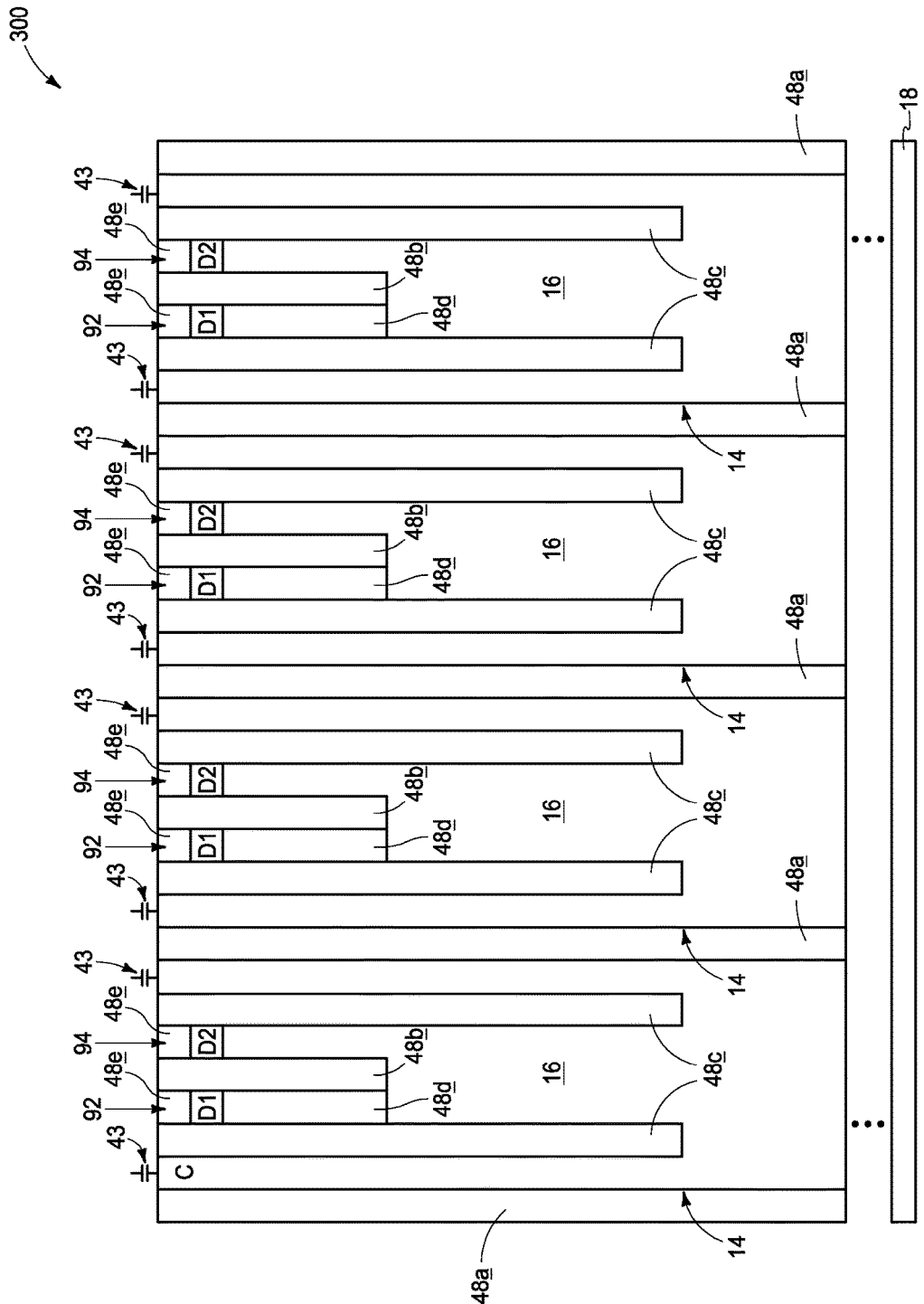

Referring to FIG. 24, trenches 92 and 94 are formed. The trenches 92 are filled with insulative material 48d, conductive material of digit line component $D_1$, and additional insulative material 48e; and the trenches 94 are filled with conductive material of digit line component $D_2$ and the insulative material 48e. Appropriate doping may be conducted at any time during the processing of FIGS. 15-24 to provide the heavily-doped regions 31 and 33 described above with reference to FIGS. 1-9, and charge-storage devices (C) may be formed at any suitable processing stage. The charge-storage devices may comprise capacitors 43 (as shown), or may comprise any other suitable devices. The construction 300 of FIG. 24 may correspond to, for example, the memory array 10 described above with reference to FIGS. 1-4, or the memory array 100 described above with reference to FIGS. 6-9.

Figure 25:
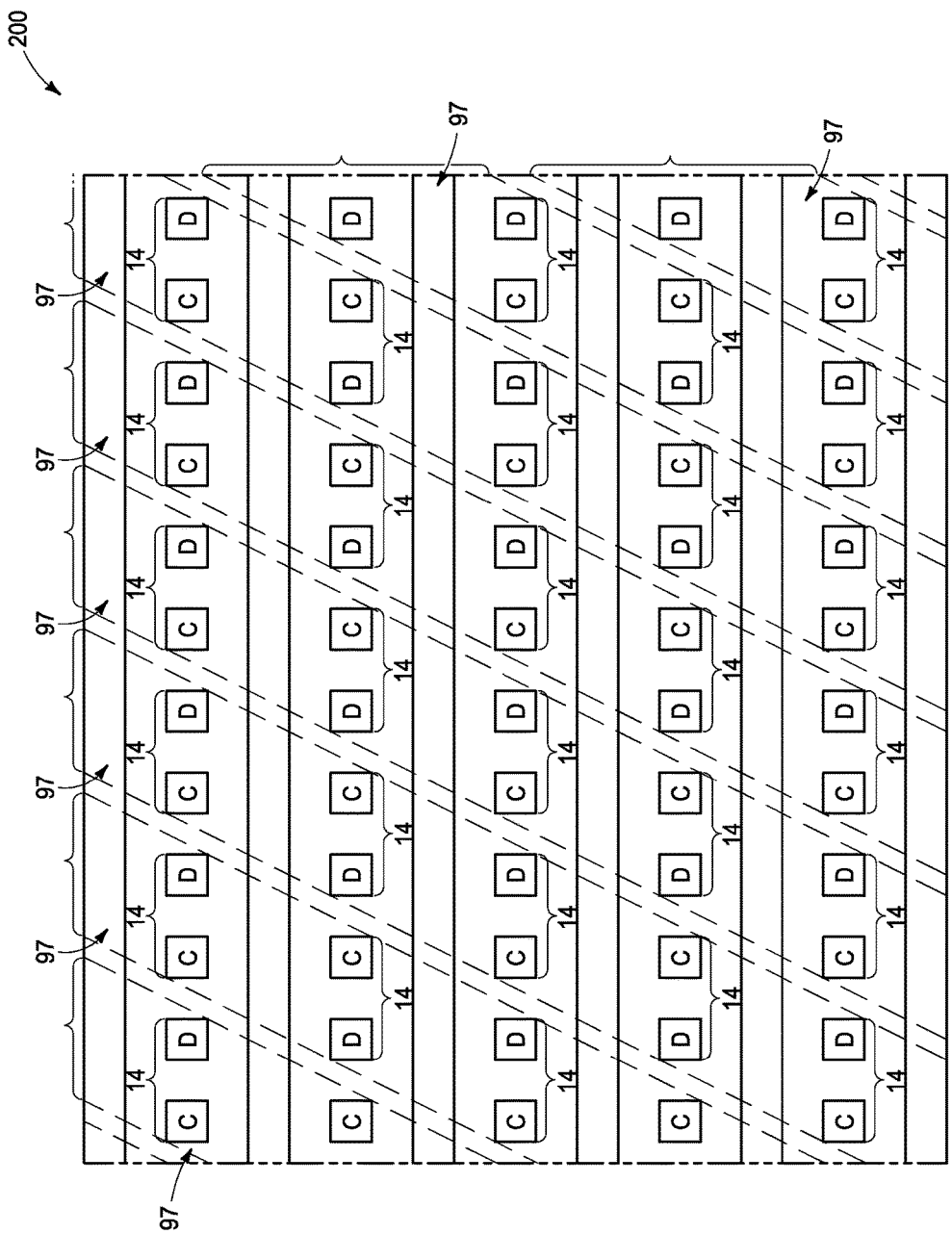
FIG. 25 is a diagrammatic top view of the example memory array of FIG. 10 showing a pattern that may be utilized for fabricating fins of such memory array.

The memory array 200 of FIGS. 10-13 may be formed with any suitable processing. In some embodiments, the fins 14 may be fabricated as trapezoidal structures with an appropriate mask. For instance, FIG. 25 diagrammatically illustrates an example arrangement of trapezoidal features 97 that may be employed during fabrication of the fins 14 in some embodiments.

The memory arrays and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, unless specifically stated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory array having first and second access transistors and first and second wordlines. The first access transistor comprises first and second source/drain regions and a first channel region between the first and second source/drain regions. The first and second access transistors are arranged in a first direction. The second access transistor comprises third and fourth source/drain regions and a second channel region between the third and fourth source/drain regions. The first wordline extends in the first direction apart from each of the first and second access transistors. The first wordline includes a first horizontal region and a first projection projecting vertically from a part of the first horizontal region. The first projection overlaps the first channel region such that current flow along the first channel region is controlled by the first projection. The second wordline extends in the first direction apart from each of the first and second access transistors. The second wordline includes a second horizontal region and a second projection projecting vertically from a part of the second horizontal region. The second projection overlaps the second channel region such that current flow along the second channel region is controlled by the second projection.

Some embodiments include a memory array having memory cells arranged in rows and columns. Memory cells in a common row include first memory cells and second memory cells. Access transistors are along the rows and comprise fins of semiconductor material. Each fin has two first pedestals and a single second pedestal between the first pedestals. First source/drain regions are within the first pedestals, and a second source/drain region is within the second pedestal. Channel regions are between the first pedestals and the second pedestal of each fin. The channel regions along each row of fins include first channel regions and second channel regions. The first channel regions are comprised by the first memory cells, and the second channel regions are comprised by the second memory cells. Wordline configurations extend along the rows. Each wordline configuration has a first wordline component and a second wordline component. The first wordline components have first projections that overlap only the first channel regions, and the second wordline components have second projections that overlap only the second channel regions. The first wordline component of one of said wordline configurations activates the first memory cells within one of the rows, and the second wordline component of said one of the wordline configurations activates the second memory cells within said one of the rows. Digit line configurations extend along the columns. Each digit line configuration comprises a first digit line component laterally along a second digit line component. Each memory cell is uniquely addressed by a wordline component and a digit line component. The memory cells include charge-storage devices over the first source/drain regions and electrically coupled with the first source/drain regions. The digit line components are over the second source/drain regions and are electrically coupled with the second source/drain regions.

Some embodiments include a memory array having memory cells arranged in rows and columns. Memory cells in a common row include first memory cells and second memory cells. Access transistors are along the rows and comprise fins of semiconductor material. Each fin has two first pedestals and a single second pedestal between the first pedestals. First source/drain regions are within the first pedestals, and a second source/drain region is within the second pedestal. Channel regions are between the first pedestals and the second pedestal of each fin. The channel regions along each row of fins include first channel regions and second channel regions. The first channel regions are comprised by the first memory cells, and the second channel regions are comprised by the second memory cells. Wordline configurations extend along the rows. Each wordline configuration has a first wordline component and a second wordline component. The first wordline components have downwardly-extending projections that overlap only the first channel regions, and the second wordline components have upwardly-extending projections that overlap only the second channel regions. The first wordline component of one of said wordline configurations activates the first memory cells within one of the rows and the second wordline component of said one of the wordline configurations activates the second memory cells within said one of the rows. The first wordline components are vertically stacked over the second wordline components. Digit line configurations extend along the columns. Each digit line configuration comprises a first digit line component laterally along a second digit line component. Each memory cell is uniquely addressed by a wordline component and a digit line component. The digit line components are over the second source/drain regions and are electrically coupled with the second source/drain regions. The memory cells include charge-storage devices over the first source/drain regions and electrically coupled with the first source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory array, comprising:
    a first access transistor, wherein the first access transistor comprises first and second source/drain regions and a first channel region between the first and second source/drain regions;
    a second access transistor, wherein the first and second access transistors are arranged in a first direction, and wherein the second access transistor comprises third and fourth source/drain regions and a second channel region between the third and fourth source/drain regions;
    a first wordline extending in the first direction apart from each of the first and second access transistors, wherein the first wordline includes a first horizontal region and a first projection projecting vertically from a part of the first horizontal region, and wherein the first projection overlaps the first channel region such that current flow along the first channel region is controlled by the first projection; and
    a second wordline extending in the first direction apart from each of the first and second access transistors, wherein the second wordline includes a second horizontal region and a second projection projecting vertically from a part of the second horizontal region, and wherein the second projection overlaps the second channel region such that current flow along the second channel region is controlled by the second projection.

2. The memory array of claim 1, wherein the first and second wordlines are stacked vertically with each other, wherein the first projection projects downwardly from the part of the first horizontal region, and wherein the second projection projects upwardly from the part of the second horizontal region.

3. The memory array of claim 2, wherein the second source-drain region of the first access transistor is formed in common to the third source-drain region of the second access transistor.

4. The memory array of claim 1, wherein each of the first and second access transistors is arranged between the first and second wordlines, wherein the first projection projects downwardly from the part of the first horizontal region, and wherein the second projection projects downwardly from the part of the second horizontal region.

5. The memory array of claim 4, wherein the second source-drain region of the first access transistor is formed in common to the third source-drain region of the second access transistor.

6. The memory array of claim 4, wherein the second source-drain region of the first access transistor is formed separately from the third source-drain region of the second access transistor.

7. The memory array of claim 1, wherein the first access transistor comprises a first fin and the second access transistor comprises a second fin, wherein the first fin comprises a first pedestal serving as the first source/drain region, a second pedestal serving as the second source/drain region and a first trough between the first and second pedestals to define the first channel region, and wherein the second fin comprises a third pedestal serving as the third source/drain region, a fourth pedestal serving as the fourth source/drain region and a second trough between the third and fourth pedestals to define the second channel region.

8. The memory array of claim 7, wherein the second pedestal is common to the third pedestal.

9. The memory array of claim 7, wherein the second pedestal is separated from the third pedestal.

10. The memory array of claim 7, wherein the first trough is substantially the same in depth as the second trough.

* * * * *